(12) United States Patent
Steensgaard-Madsen

(10) Patent No.: US 11,405,046 B2
(45) Date of Patent: Aug. 2, 2022

(54) LOW-NOISE SWITCHED-CAPACITOR CIRCUIT

(71) Applicant: Analog Devices, Inc., Norwood, MA (US)

(72) Inventor: Jesper Steensgaard-Madsen, Sequim, WA (US)

(73) Assignee: ANALOG DEVICES, INC., Norwood, MA (US)

(*) Notice: Subject to any disclaimer, the term of this patent is extended or adjusted under 35 U.S.C. 154(b) by 171 days.

(21) Appl. No.: 16/990,631

(22) Filed: Aug. 11, 2020

(65) Prior Publication Data

US 2022/0052704 A1 Feb. 17, 2022

(51) Int. Cl.
*H03M 1/12* (2006.01)
*H03F 1/42* (2006.01)
*H03F 3/00* (2006.01)

(52) U.S. Cl.
CPC .......... *H03M 1/12* (2013.01); *H03F 1/42* (2013.01); *H03F 3/005* (2013.01); *H03F 2200/156* (2013.01)

(58) Field of Classification Search
CPC .................................. H03F 1/42; H03M 1/12
See application file for complete search history.

(56) References Cited

U.S. PATENT DOCUMENTS

| | | | |
|---|---|---|---|
| 6,954,169 B1 | 10/2005 | Min | |
| 7,009,549 B1 | 3/2006 | Corsi | |
| 10,122,370 B2* | 11/2018 | Bhatta | H03L 7/0891 |
| 10,263,512 B2 | 4/2019 | Giulliano et al. | |
| 11,108,404 B1* | 8/2021 | Li | H03M 1/34 |
| 2006/0145899 A1* | 7/2006 | Markowski | H02M 3/157 341/78 |
| 2011/0012767 A1* | 1/2011 | Deval | H03M 1/0663 341/143 |
| 2012/0326901 A1* | 12/2012 | Zhao | H03M 1/0604 341/172 |
| 2014/0375374 A1* | 12/2014 | Nervegna | G01R 17/105 327/337 |

OTHER PUBLICATIONS

Notice of Allowance mailed in U.S. Appl. No. 16/990,410 dated Mar. 29, 2021, 10 pages.

* cited by examiner

*Primary Examiner* — Patricia T Nguyen
(74) *Attorney, Agent, or Firm* — Patent Capital Group

(57) ABSTRACT

Herein disclosed are multiple embodiments of a signal-processing circuit that may be utilized in various circuits, including conversion circuitry. The signal-processing circuit may receive an input and produce charges on multiple different capacitors during different phases of operation based on the input. The charges stored on two or more of the multiple different capacitors may be utilized for producing an output of the signal-processing circuit, such as by combing the charges stored on two or more of the multiple different capacitors. Utilizing the charges on the multiple different capacitors may provide for a high level of accuracy and robustness to variations of environmental factors, and/or a low noise level and power consumption when producing the output.

20 Claims, 12 Drawing Sheets

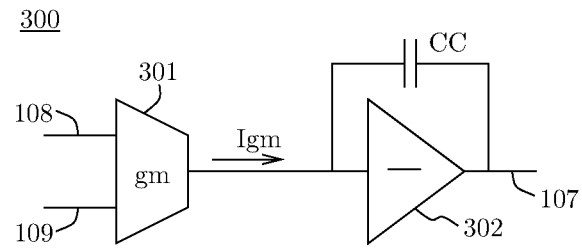
Fig. 3a
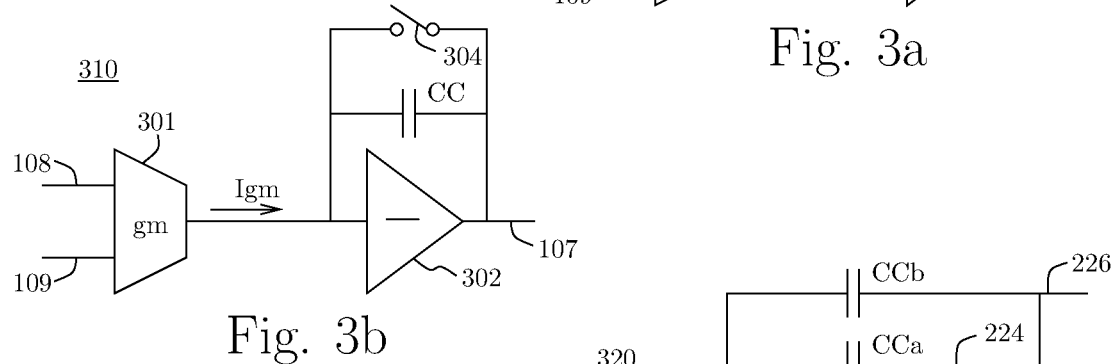
Fig. 3b
Fig. 3c
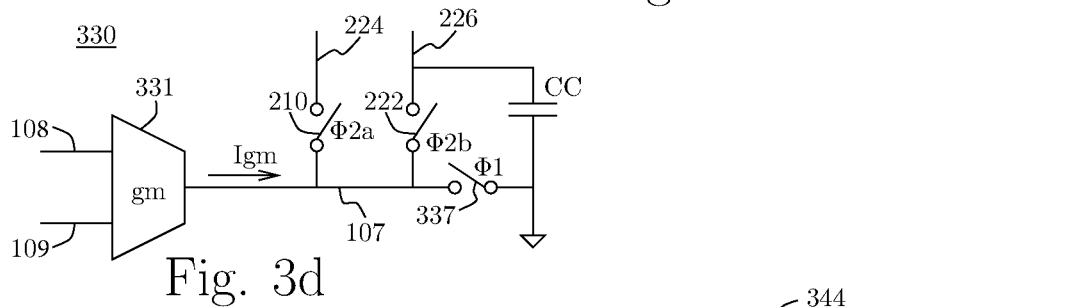
Fig. 3d
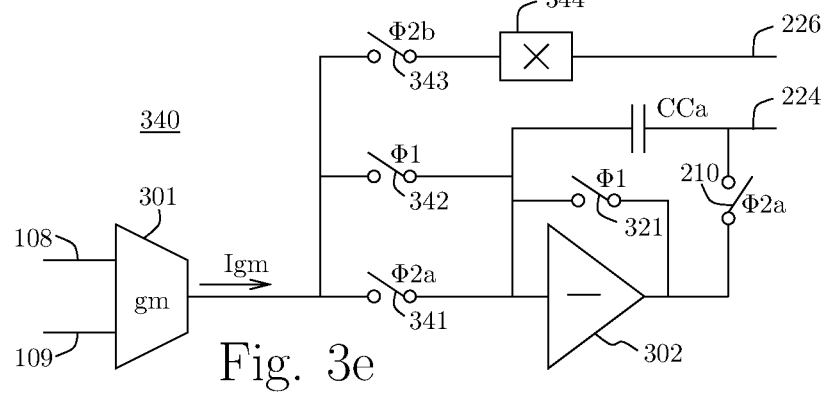
Fig. 3e

LOW-NOISE SWITCHED-CAPACITOR CIRCUIT

FIELD OF THE DISCLOSURE

This disclosure relates in general to the field of analog signal-processing circuits, and more particularly, though not exclusively, to switched-capacitor circuits.

BACKGROUND

Analog circuits may perform many types of signal processing, such as for example amplification, filtering, and modulation. Noise may be inadvertently added to an analog signal by an analog circuit, and it may be detrimental to analog signals and signal processing. It may be advantageous to amplify an analog signal early in a signal chain to reduce an impact of noise inadvertently added later in the signal chain. For example, amplification early in a signal chain may be beneficial to improve a signal-to-noise ratio. An analog amplifier circuit may itself add noise. A noise contribution by an amplifier circuit may be reduced by increasing a power consumption of the circuit, but a low power consumption may be needed or preferred for an application. There is a need for low-noise and low-power analog circuits.

An analog signal may be processed using discrete-time signal processing, which may be provided by a switched-capacitor circuit. Switched-capacitor circuits are well known to persons having ordinary skill in the art (PHOSITA). A discrete-time signal may be a sequence of analog values corresponding to a sequence of discrete points in time. The discrete points in time (a time basis) may be, but need not be, spaced uniformly in time. For example, a time basis may be once every second starting at some point in time. A characterization of a discrete-time analog signal may be a set of time-value coordinates. For example, a discrete-time signal x may be characterized by: [t=0 seconds (s), x=1.0 millivolts (mV)], [t=1 s, x=2.0 mV], [t=25, x=2.5 mV], et cetera. In many instances, a time basis may be implied and/or not fully specified. For example, a discrete-time signal x may be characterized as x(n)=1.0 mV, 2.0 mV, 2.5 mV, et cetera. An index "n" may refer to a specific element in a sequence of values x(n), or to a specific element in a sequence of points in time t(n)=0 s, 1 s, 2 s, et cetera.

Digital signals may be processed without adding any or only very little noise. A signal chain may include an analog-to-digital conversion (ADC) circuit to reduce or avoid noise being added later in the signal chain. An ADC circuit may itself add noise. A step of an analog-to-digital (A/D) conversion operation may be to amplify a residue $R1(n)$ of a voltage $V1(n)$ with respect to a digital code $CODE1(n)$ and a reference voltage VREF, where digital code $CODE1(n)$ is an approximation digital representation of the voltage $V1(n)$, which may be a sample of a continuous-time input voltage waveform VIN(t). A switched-capacitor circuit may be used to amplify a residue voltage $R1(n)=V1(n)-VREF \cdot CODE1(n)$.

FIG. 1 shows a prior-art example ADC circuit 100 including a timing diagram. The ADC circuit 100 may have actions performed at different times, where times that a first group of actions are performed are indicated by a first phase $\phi1$ and times that a second group of actions are performed are indicated by a second phase $\phi2$. For example, switches within ADC circuit 100 labeled with $\phi1$ may be closed during phase $\phi1$ and open during phase $\phi2$ and switches within the ADC circuit 100 labeled with $\phi2$ may be closed during phase $\phi2$ and open during phase $\phi1$. The closing and opening of the switches may cause different actions to be performed within the ADC circuit 100. FIG. 1 shows a signal chart of signals related to the ADC circuit 100. The signals include a first timing control signal $\phi1$ and a second control timing control signal $\phi2$, where the first timing control signal $\phi1$ and the second timing control signal $\phi2$ are shown in a high state to indicate that the labeled switches corresponding to each of the phases are closed and in a low state to indicate that the labeled switches corresponding to each of the phases are open. The switches corresponding to the first phase $\phi1$ may not be closed at the same time as the switches corresponding to the second phase $\phi2$. Accordingly, the first timing control signal $\phi1$ and the second timing control signal $\phi2$ may not be in a high state at the same time, which can be referred to as the first timing control signal $\phi1$ being non-overlapping in time with the second timing control signal $\phi2$. The continuous-time input voltage waveform VIN(t) may be sampled on a capacitor C1 at falling edges of the first timing control signal $\phi1$ to provide a sequence of voltages $V1(n)$. A quantizer circuit ADC1 may sample VIN(t) at substantially the same points in time (falling edges of the first timing control signal $\phi1$) and produce a sequence of digital codes $CODE1(n)$ to approximately represent $V1(n)$. PHOSITA will recognize that a relationship may be $CODE1(n) \approx V1(n)/VREF$, although an implicit input for a reference voltage is not shown explicitly for ADC1, ADC2, or DAC1 in FIG. 1. Furthermore, during phase $\phi1$ (when the first timing control signal $\phi1$ is high), a capacitor C2 that is configured to provide negative feedback for an amplifier circuit 102 may be discharged by a switch 118 to reset it to a predefined initial state (for example, 0 volts (V)). Subsequently, during phase $\phi2$ (when the second timing control signal $\phi2$ is high), DAC1 may digital-to-analog (D/A) convert $CODE1(n)$ and provide a voltage $VREF \cdot CODE1(n)$. Capacitor C1 may be connected to amplifier circuit 102 via a switch 104. A quantity of charge $Q1(n)=C1 \cdot (VREF \cdot CODE1(n)-V1(n))=(-C1 \cdot R1(n))$ may be transferred via switch 104 and accumulated on capacitor C2. An amplified residue voltage $V2(n)=A \cdot R1(n)$ may be available at an input of a quantizer circuit ADC2 and sampled on a capacitor C3 at a falling edge of the second timing control signal $\phi2$ when a sampling switch 112 opens. A factor of amplification may be $A=C1/C2$. A polarity of a factor of amplification may be not important (and it may be omitted), as a polarity may be changed repeatedly in a signal chain. A sampling network including capacitor C3 is shown explicitly for ADC2, but not for ADC1. A reason for showing this extra detail of quantizer ADC2 may be to make it easier to compare features of ADC 100 including a switched-capacitor circuit 150 to features of several embodiments of the present teaching that will be described in detail. ADC2 may provide a code $CODE2(n)$ that may be combined with code $CODE1(n)$ to provide a digital representation of sampled input value $V1(n)$. PHOSITA will recognize that a circuit block 106 may be a capacitive digital-to-analog converter (CDAC) circuit, and that an individual element thereof (for example, capacitor C1) may be an array of elements (for example, a capacitor array). Specifically, DAC1 may be an array of switches connecting individual capacitors in an array of capacitors (for example, capacitor C1) to either a high or a low reference potential during phase $\phi2$. Various types of CDAC circuits are well known and need not be described in detail herein.

ADC 100 of FIG. 1 is an example of a circuit and signal processing that may provide amplification to reduce an impact of noise (and other potential errors and imperfections) after the amplifier (for example, from ADC2). Low-noise, low-power and highly accurate circuits may be needed to implement state-of-the-art signal-processing circuits. Signal-processing circuits are used for a myriad of applications, including avionics, vehicles, navigation, medical devices, industrial automation, audio-visual equipment, communication, et cetera.

Amplifier circuit 102 of ADC 100 may be configured to settle substantially fully to minimize a potential settling error and/or to ensure that a factor of amplification is determined substantially by a capacitor ratio having relatively little uncertainty and/or little sensitivity to environmental factors. For example, a settling period T (for example, a duration of timing control signal φ2 being high) may be at least P=10 times longer than a time constant t for a linear settling operation of amplifier circuit 102 in a negative-feedback configuration. A nominal factor of amplification may be $A=(C1/C2)\cdot(1-\exp(-P))$, where $P=T/\tau$ may be referred to as a degree of settling. On the one hand, choosing a high degree of settling (for example, P>10) may imply that a factor of gain may be substantially determined by a capacitor ratio, $A \approx C1/C2$. On the other hand, choosing a relatively small degree of settling (for example, $P \approx 1$) may imply that characteristics of a signal-processing operation (for example, amplifying $R1(n)$) may be subject to considerable uncertainty and/or imperfection. A value of $P=T/\tau$ may vary with temperature, supply voltage, and/or other environmental factors via settling period T and/or time constant τ. A switched-capacitor circuit 150 may be designed to reduce/limit a variation of $P=T/\tau$ with respect to environmental factors, but a small degree of variation may persist (for example, ±5%). A sensitivity of a nominal gain factor $A=(C1/C2)\cdot(1-\exp(-P))$ with respect to variations of P may decrease for increasing values of P. Accordingly, a factor of gain A may be increasingly sensitive to variations of environmental factors when a nominal degree of settling P is decreased. A common practice for the design of accurate switched-capacitor circuits may be to configure them for a high degree of settling.

An amplifier circuit may exhibit non-linear settling (for example, caused by clewing) for large signals. A significant benefit of using discrete-time analog signal processing may be that artifacts caused by non-linear settling may be suppressed greatly by providing a sufficiently long period T for settling. As a circuit settles (linearly or non-linearly) a magnitude of a perturbation (deviation from a target, such as a virtual-short condition) may decrease gradually. The circuit may eventually reach a substantially linear settling operation (for example, a small-signal condition), which may be characterized by a time constant T.

Configuring a switched-capacitor circuit for a high degree of settling may be beneficial to suppress many types of imperfections, but it may be detrimental for a power consumption and/or a noise level of the circuit. Decreasing a time constant t to increase a degree of settling P may increase a bandwidth/speed of the circuit, and a noise bandwidth thereof. A noise level may be a combination of a noise bandwidth and a spot noise. A spot noise may be decreased (for example, by increasing a power consumption) to counter for an increase in a noise bandwidth to achieve a target noise level.

Accordingly, choosing a degree of settling may be a compromise between on the one hand reducing a noise level and/or a power consumption (by reducing degree of settling), and on the other hand increasing accuracy and robustness to variations of environmental factors (by increasing degree of settling).

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIG. 3a shows an example two-stage amplifier circuit that may be used as an amplifier in switched-capacitor circuit of FIG. 2 for an embodiment of the present teaching.

FIG. 3b shows an example amplifier circuit that may be a variation of amplifier circuit of FIG. 3a, according to various embodiments.

FIG. 3c shows an example composite circuit that may be an implementation of block 402 of FIG. 4, according to various embodiments.

FIG. 3d shows another example composite circuit that may be an implementation of block 402 of FIG. 4, according to various embodiments.

FIG. 3e shows yet another example composite circuit that may be an implementation of block 402 of FIG. 4, according to various embodiments.

SUMMARY OF THE DISCLOSURE

Figure 1:
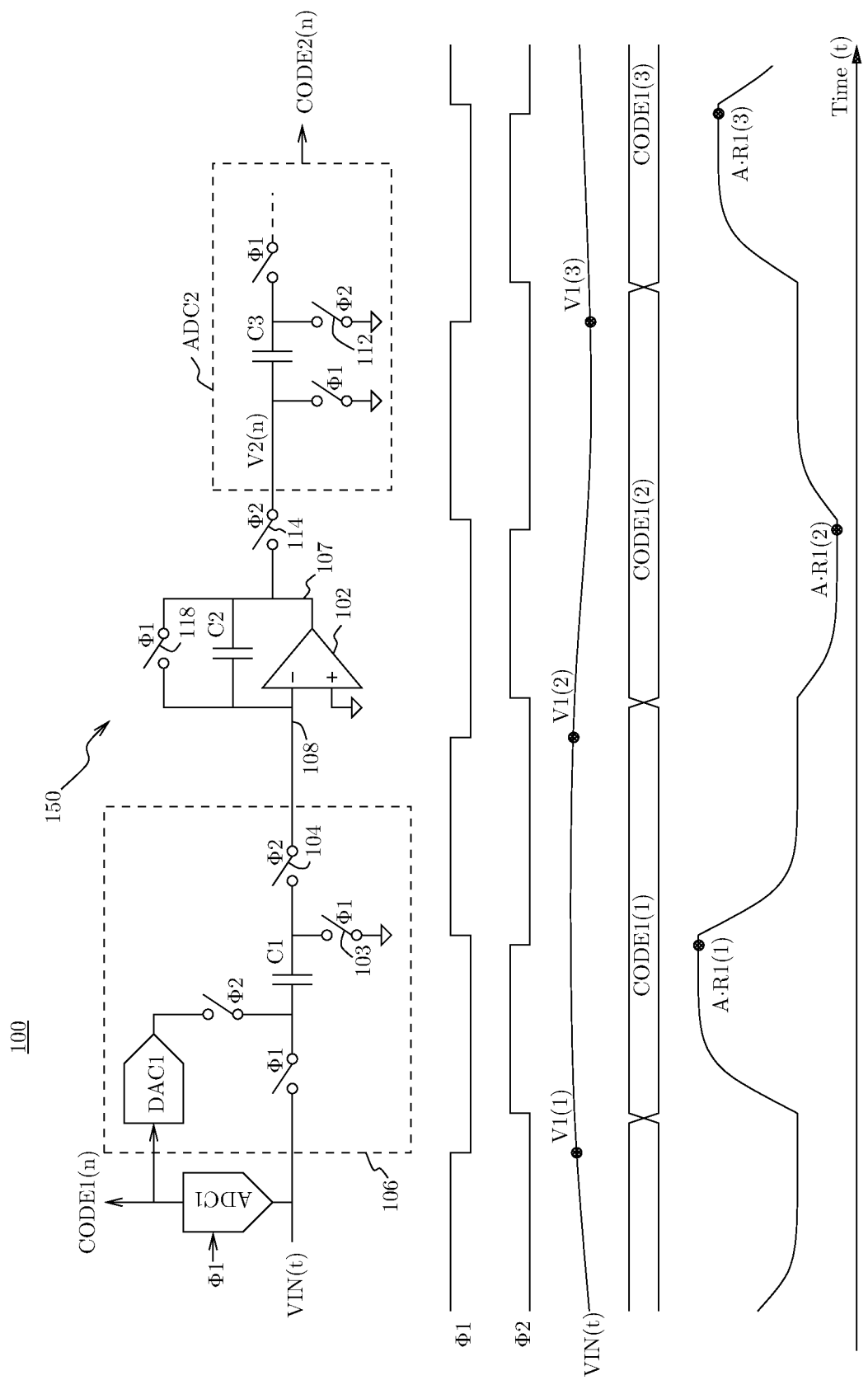
FIG. 1 shows a prior-art example ADC circuit including a timing diagram.

Herein disclosed are multiple embodiments of a signal-processing circuit that may be utilized in various circuits, including conversion circuitry. The signal-processing circuit may receive an input and produce charges on multiple different capacitors during different phases of operation based on the input. The charges stored on two or more of the multiple different capacitors may be utilized for producing an output of the signal-processing circuit, such as by combining the charges stored on two or more of the multiple different capacitors. Utilizing the charges on the multiple different capacitors may provide for a high level of accuracy and robustness to variations of environmental factors, and/or a low noise level and power consumption when producing the output.

Herein disclosed in some embodiments is a signal-processing circuit to receive an input value. The signal-processing circuit may include an amplifier circuit, and a first capacitor to be coupled with the amplifier circuit in a negative-feedback configuration during a first phase of operation. The signal processing circuit may further include a second capacitor to be coupled to the amplifier circuit during a second phase of operation, the second phase of operation to occur after the first phase of operation, wherein a quantity of charge stored on the first capacitor is to be substantially constant during the second phase of operation, wherein a signal value responsive to the input value is to be derived through combination of a first quantity of charge with a second quantity of charge, and wherein the first quantity of charge is responsive to a voltage across the first capacitor and the second quantity of charge is responsive to a voltage across the second capacitor.

Herein disclosed in some embodiments is a method for processing a signal in a signal-processing circuit. The method may include, during a first phase of operation, coupling a first capacitor in a negative-feedback configuration with an amplifier circuit, the amplifier circuit to charge the first capacitor responsive to an input value applied to the signal-processing circuit. The method may further include, during a second phase of operation wherein a quantity of charge stored on the first capacitor is to be substantially constant, coupling a second capacitor to the amplifier circuit to charge the second capacitor responsive to a potential imperfection of the quantity of charge stored on the first capacitor. The method may further include producing a signal value responsive to the input value by combining a first quantity of charge that is responsive to charge stored on the first capacitor with a second quantity of charge that is responsive to charge stored on the second capacitor.

Herein disclosed in some embodiments is a signal-processing circuit, comprising a means for amplification of a signal, and a first means for storing charge to be coupled in a negative-feedback configuration with the means for amplification during a first phase of operation. The signal-processing circuit may further include a second means for storing charge to be coupled to the means for amplification during a second phase of operation, wherein a quantity of charge stored on the first means for storing charge is to be substantially constant during the second phase of operation, wherein a signal value responsive to an input value of the signal-processing circuit is to be derived by combination of a first quantity of charge with a second quantity of charge, wherein the first quantity of charge is responsive to a voltage across the first means for storing charge and the second quantity of charge is responsive to a voltage across the second means for storing charge.

Herein disclosed in some embodiments is a signal-processing circuit. The signal-processing circuit may include an amplifier circuit having an input terminal, and a first load capacitor coupled to the input terminal of the amplifier circuit via a first feedback capacitor. The signal-processing circuit may further include a first switch for coupling the first feedback capacitor and the amplifier circuit in a negative-feedback configuration during a first phase of operation, the first phase of operation preceding a second phase of operation, wherein the amplifier circuit charges the first feedback capacitor and the first load capacitor during the first phase of operation, wherein a quantity of charge shared by the first feedback capacitor and the first load capacitor is substantially constant during the second phase of operation, wherein the amplifier circuit is coupled to a second load capacitor during the second phase of operation, and wherein a combination of a first charge quantity sampled on the first load capacitor in combination with a second charge quantity sampled on the second load capacitor is an output value derived from an input value.

Herein disclosed in some embodiments is a signal-processing method. The method may include adjusting a first value gradually during a first step to regulate a predefined combination of the first value and an input value towards a target, and holding the first value substantially constant after the first step. The method may further include deriving, in a second step after the first step, a second value responsive to a difference between the target and the predefined combination of the first value and the input value, wherein a sampled combination of the first value and the second value is derived from the input value substantially in accordance with a predefined signal-processing operation.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

For ADC circuits, it may be beneficial to have a circuit that can be configured to achieve both 1) a high level of accuracy and robustness to variations of environmental factors and 2) a low noise level and power consumption. Further, an accurate low-noise switched-capacitor circuit may be beneficial for ADC circuits. ADC circuits described herein may provide one or more of these benefits.

Figure 2:
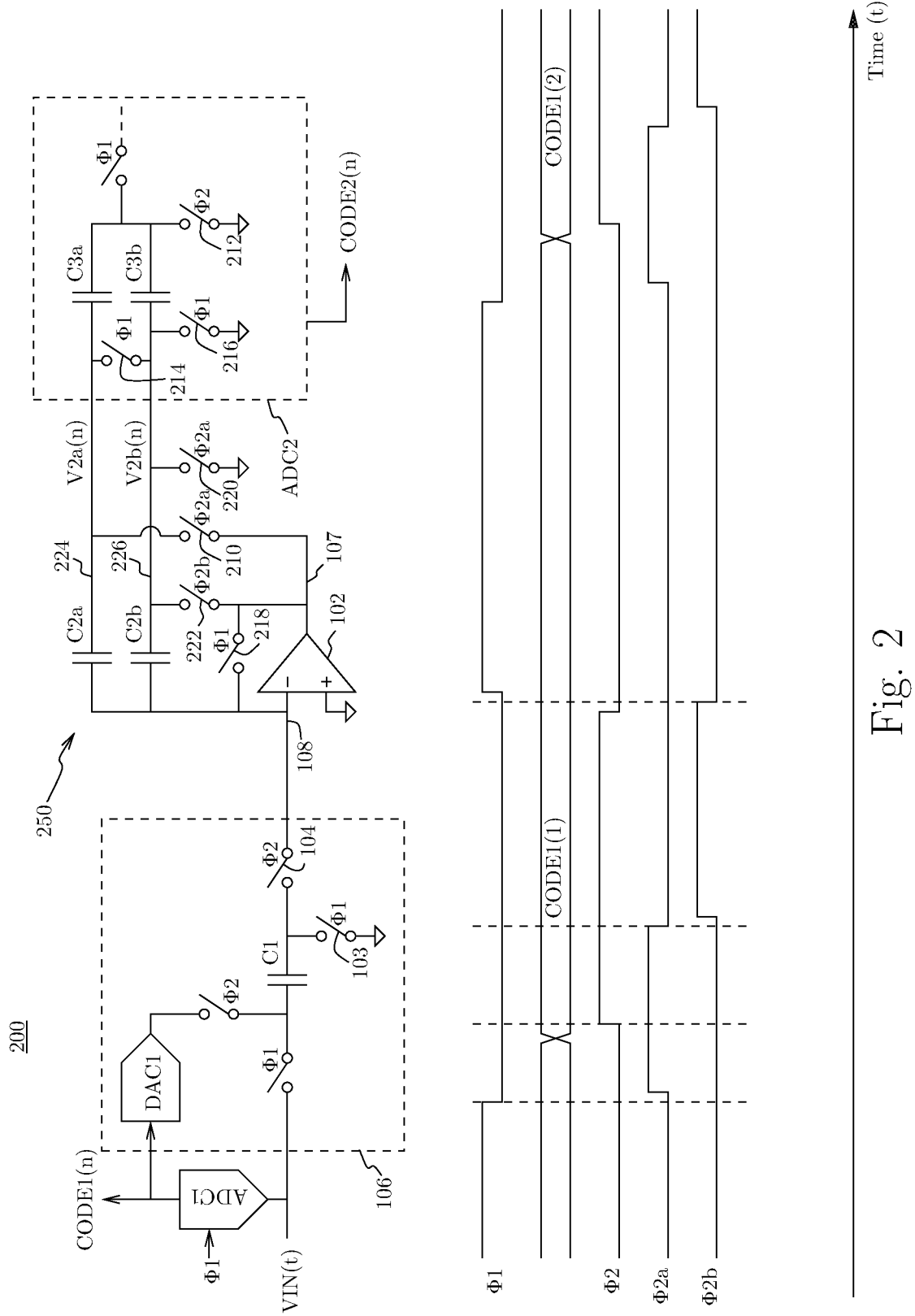
FIG. 2 shows an example ADC circuit and corresponding timing diagram, according to various embodiments.

FIG. 2 shows an ADC circuit 200, according to various embodiments. The ADC circuit 200 may include some features similar to ADC circuit 100 of FIG. 1. ADC circuit 200 may include a residue-amplifier switched-capacitor circuit 250 that may be a first embodiment of the present teaching. Quantizer circuit ADC1 and CDAC circuit 106 may have features identical or equivalent to the features of those corresponding elements of FIG. 1. Accordingly, as has been already described, a quantity of charge $Q1(n)=C1 \cdot (VREF \cdot CODE1(n)-V1(n))=(-C1 \cdot R1(n))$ may be nominally transferred via switch 104 during phase $\phi2$. Switched-capacitor circuit 250 includes a load circuit that may be comprised in a quantizer circuit ADC2 (for example, a sampling circuit for ADC2, which may be a part of a CDAC circuit). It may be instructive to first consider properties of the load circuit.

An output value (for example, an amplified residue input value) may be a combination of a first charge quantity sampled on a first load capacitor C3a and a second charge quantity sampled on a second load capacitor C3b. For example, an output value $Qout(n)=V2a(n) \cdot C3a+V2b(n) \cdot C3b=V2(n) \cdot (C3a+C3b)$ may be sampled when a sampling switch 212 opens at a falling edge of second timing control signal ϕ2, where V2a(n) may be a voltage at a first output of the switched-capacitor circuit 250 corresponding to a capacitor C2a and V2b(n) may be a voltage at a second output of the switched-capacitor circuit 250 corresponding to a capacitor C2b. The first charge quantity and the second charge quantity may be combined by a charge-sharing operation when a switch 214 is closed during a subsequent phase ϕ1. It may be instructive to compare FIG. 2 to FIG. 1, where an output value Qout(n)=V2(n)·C3 may be sampled on a capacitor C3 when a sampling switch 112 opens at a falling edge of the second timing control signal ϕ2. The output value Qout(n) of the ADC circuit 100 of FIG. 1 and the output value Qout(n) of the ADC circuit 200 of FIG. 2 may be nominally identical for a same input, and switched-capacitor circuit 150 (FIG. 1) and switch-capacitor circuit 250 may be nominally interchangeable. Accordingly, a switched-capacitor circuit according to the present teaching may be used as a substitute for, or in combination with, a conventional switched-capacitor circuit. Switched-capacitor circuits are ubiquitous, and a potential range of applications for the present teaching is very wide.

A signal value (for example, an output value) may be a combination of a plurality of values (for example, a combination of V2a(n) and V2b(n)) sampled on a plurality of circuit elements (for example, capacitor C3a and capacitor C3b) and then combined. The plurality of values may be, but need not be, sampled simultaneously at a sampling instant (for example, a falling edge of the second timing control signal ϕ2).

Now consider how switched-capacitor circuit 250 may provide the first charge quantity and the second charge quantity sampled on load capacitor C3a and load capacitor C3b, respectively. During a preceding phase ϕ1, a switch 218 may provide negative feedback for amplifier circuit 102, and a virtual-short potential (for example, a virtual ground, 0 volts (V)) may be established at an input terminal 108 of amplifier circuit 102 (for example, an inverting input). Further, switch 214 and a switch 216 may be closed, and a first feedback capacitor C2a and a second feedback capacitor C2b may be each reset to a predefined initial state (for example, nominally 0V). An operation of resetting feedback capacitor C2a and feedback capacitor C2b during phase ϕ1 may be equivalent to an operation of resetting capacitor C2 by closing switch 118 in FIG. 1.

A signal-processing operation (for example, amplifying a residue value in an ADC circuit 200) of switched-capacitor circuit 250 may include a first phase of operation ϕ2a (in other words, phase ϕ2a) and a second phase of operation ϕ2b (in other words, phase ϕ2b). FIG. 2 shows a timing diagram for several timing control signals, in particular timing control signal ϕ1, timing control signal ϕ2, timing control signal ϕ2a, and timing control signal ϕ2b. The timing control signals may indicate when different actions are performed by the ADC circuit 200. For example, the timing control signals may indicate when switches of the ADC circuit 200 are open and closed. In particular, the switches of the ADC circuit 200 are labeled with indications of a corresponding phase, where the timing control signal of the corresponding phase control the operation of the corresponding switches having the matching phase label. For example, switches labeled with ϕ1 may be controlled by the timing control signal ϕ1, switches labeled with ϕ2 may be controlled by the timing control signal ϕ2, switches labeled with ϕ2a may be controlled by the timing control signal ϕ2a, and switches labeled with ϕ2b may be controlled by the timing control signal ϕ2b. In the illustrated embodiment, the timing control signal being high may indicate that the corresponding switches are closed, while the timing control signal being low may indicate that the corresponding switches are open. Times when timing control signal ϕ1 is high may be non-overlapping with times that timing control signal ϕ2a and timing control signal ϕ2b are high. A falling edge of timing control signal ϕ2b may occur a short delay (for example, 200 picoseconds (ps)) after a falling edge of ϕ2. It is well-known by PHOSITA that artifacts of a sampling operation may be suppressed by providing a short delay for one or more edges of timing control signals. For example, in ADC 100 of FIG. 1, a switch 114 may be configured to open a short delay (for example, 200 ps) after sampling switch 112 opens. Timing control signal ϕ1 and timing control signal ϕ2 may be similar or identical in FIGS. 1 and 2 (timing diagrams may be drawn not to scale). PHOSITA are familiar with the design and implementation of circuits that provide timing control signals with desired properties, including providing short delays as they may be appropriate. Accordingly, details about timing and timing circuits, including when and how to provide short delays to suppress artifacts, need not be described herein.

A first phase of operation ϕ2a (when timing control signal ϕ2a is high) may begin a short delay (for example, 200 ps) after a falling edge of timing control signal ϕ1 when a signal value V1(n) may be sampled on capacitor C1. A first switch 210 may be closed during the first phase of operation ϕ2a to couple first feedback capacitor C2a and amplifier circuit 102 in a negative-feedback configuration wherein amplifier circuit 102 may charge capacitor C2a and first load capacitor C3a via switch 210. Switch 104 may not close until (and a settling period T may not start until) a rising edge of timing control signal ϕ2, which may be delayed until CODE1(n) is provided by ADC1 and a corresponding voltage is output by DAC1. In another embodiment (for example, a generic switched-capacitor amplifier circuit), a rising edge of timing control signal ϕ2 may be substantially simultaneous with a rising edge of timing control signal ϕ2a.

When switch 104 closes at a rising edge of timing signal ϕ2, a quantity of charge Q1(n)=C1·(VREF·CODE1(n)−V1(n))=(−C1·R1(n)) may be nominally transferred via switch 104 and accumulated on the first feedback capacitor C2a. Amplifier circuit 102 may be configured for a high degree of settling (for example, P>6) during phase ϕ2a, and a nominal voltage at node 224 at an end of phase ϕ2a (in other words, at a falling edge of timing control signal ϕ2a) may be (C1/C2a)·R1(n). However, an actual voltage at terminal 224 may include a noise component that may be significant if amplifier 102 is low-power and configured for a high degree of settling (for example, P>6). Specifically, when switch 210 opens at an end of the first phase of operation ϕ2a, a voltage at terminal 224 may be V2a(n)=(C1/C2a)·R1(n)+N2a(n), where N2a(n) may represent a deviation from a nominal value. The error-type value N2a(n) may be, but need not be, a substantially stochastic (noise-like) error. For example, N2a(n) may include noise as well as errors due to charge injection, incomplete and/or non-linear settling, et cetera. In an embodiment, an amplifier circuit may be configured for a high degree of settling in a first phase of operation so that an error (for example, N2a(n)) may be substantially independent of an input value (for example, residue R1(n)). In an embodiment, a first error comprised in a first charge quantity sampled on a first load capacitor may be a substantially noise-like error.

A second phase of operation ϕ2b (when timing control signal ϕ2b is high) may start a short delay (for example, 200 ps) after the first phase of operation (in other words, after a falling edge of timing control signal ϕ2a). Switch 210 may be open, and a quantity of charge shared by the first feedback capacitor C2a and the first load capacitor C3a (for example, on terminal 224) may be substantially constant (for example, it may be substantially isolated) during the second phase of operation φ2b. Accordingly, a quantity of charge stored on the first feedback capacitor C2a may be substantially constant during the second phase of operation φ2b. Furthermore, switch 220 may be open and switch 222 may be closed to couple amplifier circuit 102 to the second load capacitor C3b.

An objective of the second phase of operation φ2b may be to charge the second load capacitor C3b with a second quantity of charge to substantially cancel, in an output value, a first error C3a·N2a(n) that may be comprised in a first quantity of charge sampled on the first load capacitor C3a when sampling switch 212 opens at a falling edge of timing control signal φ2. In other words, it may be an objective to charge the second load capacitor C3b to a value that will substantially cancel an error N2a(n) in an output value. Specifically, it may be an objective for terminal 226 to be charged to a voltage (−C3a/C3b)·N2a(n) when sampling switch 212 opens. To enable that, amplifier circuit 102 may be configured to be responsive during phase φ2b to charge stored on the first load capacitor C3a. Specifically, the first load capacitor C3a may be coupled to an input terminal 108 of amplifier circuit 102 via first feedback capacitor C2a. A charge stored on the first load capacitor C3a, including a potentially non-zero first error C3a·N2a(n), may be represented by a voltage at node 224, which may couple to amplifier input terminal 108 via first feedback capacitor C2a. The second load capacitor C3b may be, but need not be, coupled to amplifier input terminal 108 via a second feedback capacitor C2b. Switch 222 may couple second feedback capacitor C2b and amplifier circuit 102 in a negative-feedback configuration during phase φ2b. A combination of charge stored on the first feedback capacitor C2a and charge stored on the second feedback capacitor C2b may correspond to a quantity of charge representing an input value (for example, Q1(n)=−C1·R1(n)) when amplifier input terminal 108 is at a predefined target voltage (for example, a target for a settling operation may be zero voltage between two amplifier input terminals, such as ground and terminal 108). If amplifier circuit 102 is configured to settle fully, a nominal voltage at node 226 may be (−C2a/C2b)·N2a(n) when sampling switch 212 opens. In that case, a second quantity of charge sampled on the second load capacitor C3b may be nominally C3b·(−C2a/C2b)·N2a(n). An objective of cancelling a first error C3a·N2a(n) comprised in a first quantity of charge sampled on the first load capacitor C3a may be achieved nominally when C3a=C3b·(C2a/C2b), in other words, when (C3b/C3a)=(C2b/C2a), assuming full settling in phase φ2b. However, an actual voltage at node 226 may include a noise component. Specifically, when sampling switch 212 opens at a falling edge of timing control signal φ2, a voltage at node 226 may be V2b(n)=(−C2a/C2b)·N2a(n)+N2b(n), where N2b(n) may represent a deviation from a nominal value. N2b(n) may be a noise-like error. Accordingly, a first error C3a·N2a(n) sampled on the first load capacitor C3a may be nominally cancelled in an output value, and a second error C3b·N2b(n) sampled on the second load capacitor C3b may be comprised in the output value. The first error C3a·N2a(n) may comprise a noise contribution from a sampling event, which PHOSITA may recognize and may be referred to as kT/C sampling noise. To achieve a relatively reduced noise level, it may be an objective that C3b·N2b(n) be smaller than C3a·N2a(n), for example in terms of a root-mean-squares (rms) value. Both errors, C3a·N2a(n) and C3b·N2b(n), may be defined with respect to a sampling event that may occur when switch 212 opens.

It may be advantageous to configure amplifier circuit 102 for a relatively low degree of settling (for example, P<6) during the second phase of operation φ2b. Reducing a degree of settling may reduce a noise bandwidth, which may reduce a rms value of C3b·N2b(n) and an overall noise level of switched-capacitor circuit 250. It may be further advantageous to configure amplifier circuit 102 for a high degree of settling (for example, P>6) during the first phase of operation φ2a. Choosing a high degree of settling may improve an accuracy of switched-capacitor circuit 250 by suppressing non-linear artifacts in the first error C3a·N2a(n) and/or by ensuring that the first error may be substantially noise-like. A noise level of the first error may have relatively little impact on an overall noise level of switched-capacitor circuit 250.

By providing a plurality of phases of operation (for example, first phase of operation φ2a and second phase of operation φ2b) and by deriving a signal value as a combination of values derived in the plurality of phases of operation, a switched-capacitor circuit may provide 1) a high level of accuracy and robustness to variations of environmental factors and/or 2) a low noise level and power consumption.

In an embodiment, amplifier circuit 102 may be configured for a relatively high degree of settling (for example, P>6) in a first phase of operation φ2a. That may result in a first rms value for a first error C3a·N2a(n) sampled on the first load capacitor C3a. The relatively high degree of settling may be advantageous and/or necessary to achieve a high degree of accuracy for switched-capacitor circuit 250. The relatively high degree of settling may be further advantageous and/or necessary to ensure that the first error C3a·N2a(n) may be of a noise-like nature and/or that it may be substantially independent of an input value residue R1(n). Amplifier circuit 102 may be further configured for a relatively low degree of settling (for example, P<6) during a second phase of operation φ2b. That may result in a second rms value for a second error C3b·N2b(n) sampled on the second load capacitor C3b. The second rms value may be less (for example, 6 dB less) than the first rms value. An overall noise level may depend primarily by the (low) second rms value, and it may be relatively independent of the (higher) first rms value. Accordingly, a switched-capacitor circuit 250 may be accurate due to fast settling in a first phase of operation, and it may be low noise and low power due to slow settling in a second phase of operation.

If amplifier circuit 102 is configured for a low degree of settling during a second phase of operation φ2b, a voltage at node 226 may have not yet reached a nominal asymptotic value (−C2a/C2b)·N2a(n) when sampling switch 212 opens. In an embodiment, amplifier circuit 102 may be configured to settle nominally for P=1 time constant t during phase φ2b before sampling switch 212 opens. A nominal degree of settling may be P=1, and it may vary by at most ±5% with respect to environmental factors. Amplifier circuit 102 may be configured to start the second phase of operation φ2b from an initial state at zero, and a voltage at terminal 226 may be V2b(n)=(−C2a/C2b)·(1−exp(−P))·N2a(n)+N2b(n) when sampling switch 212 opens. The expression (1−exp(−P)) may vary by up to approximately ±3% with respect to environmental factors. Specifically, it may vary in a range from (1−exp(−0.95))≈0.61 to (1−exp(−1.05))≈0.65. The second load capacitor C3b may be scaled to nominally provide substantially complete cancellation of the first error C3a·N2a(n) in an output value for a nominal degree of settling, which may be achieved for $C3b \cdot (C2a/C2b) \cdot (1-\exp(-P))=C3a$, or equivalently for $(C3b/C3a)=(C2b/C2a)/(1-\exp(-P))\approx 1.58 \cdot (C2b/C2a)$. Accordingly, a ratio of a capacitance of a second load capacitor C3b divided by a capacitance of a first load capacitor C3a may be larger (for example, 10 percent or 58 percent larger) than a ratio of a capacitance of a second feedback capacitor C2b divided by a capacitance of a first feedback capacitor C2a. A 3% variation of $(1-\exp(-P))$ with respect to environmental factors may result in an imperfect cancellation of the first error $C3a \cdot N2a(n)$ for some environmental factors. A rms value of a residual (imperfectly cancelled) first error $C3a \cdot N2a(n)$ comprised in an output value may be significantly less (for example, 20 dB less) than a rms value of a second error $C3b \cdot N2b(n)$ comprised in the output value. Accordingly, a noise level for a switched-capacitor circuit 250 may be reduced by configuring an amplifier circuit 102 for a low degree of settling (for example, P<6) during a second phase of operation φ2b compared to configuring it for a high degree of settling (for example, P>6) during a first phase of operation φ2a. A reduction in a noise level may be achieved by reducing a noise bandwidth, which may be achieved by increasing a settling time constant for phase φ2b.

A reasonably small degree of variation (for example, ±5%) of a factor of gain with respect to environmental factors during the second phase of operation φ2b may have relatively little impact on an overall noise level of a switched-capacitor circuit 250. A degree of settling during a second phase of operation φ2b may be selected to optimize a trade-off. A very low degree of settling may be selected to minimize a noise bandwidth and a rms value of a second error $C3b \cdot N2b(n)$, but that may come at an expense of potentially increasing a rms value of a residual (imperfectly cancelled) first error $C3a \cdot N2a(n)$. A higher degree of settling may be selected to improve a cancellation of a first error $C3a \cdot N2a(n)$ in an output value, but that may come at an expense of increasing a noise bandwidth and a rms value of the second error $C3b \cdot N2b(n)$. An optimal degree of settling may depend on a circuit's sensitivity to variations of environmental factors. In some instances, a sensitivity may be low, and an embodiment may be configured for a very low (for example, P≈1) or no (for example, a zero or minimal) degree of settling. A substantially open-loop configuration of amplifier circuit 102 during the second phase of operation φ2b may correspond to a minimal degree of settling during phase φ2b. Accordingly, in an embodiment, a nominal capacitance of the second feedback capacitor C2b may be zero, in other words, it may be removed from switched-capacitor circuit 250 to an extent reasonably possible (a parasitic capacitor may be unavoidable). For a substantially open-loop configuration, a voltage at amplifier input terminal 108 may be substantially constant during phase φ2b. Amplifier circuit 102 may be configured to start operating in phase φ2b from a predefined initial state at zero, and a voltage at terminal 226 may be a ramp-type signal. For example, in an embodiment, amplifier circuit 102 may be configured to output a current (in other words, it may be configured to operate as a transconductance circuit) during the second phase of operation φ2b. The output current may be accumulated on the second load capacitor C3b, and the charge (accumulated current) may be sampled on C3b when sampling switch 212 opens. In another embodiment, a two-stage amplifier may be configured in a substantially open-loop configuration during phase φ2b, and it may provide a ramp-type signal at terminal 226.

FIG. 3a shows a two-stage amplifier circuit 300 that may be used as amplifier 102 in switched-capacitor circuit 250 in FIG. 2 for an embodiment of the present teaching. Two-stage amplifier circuit 300 may comprise a first amplifier stage 301 and a second amplifier stage 302. The first amplifier stage 301 may be a transconductance circuit stage that may provide a current Igm that may be nominally proportional to a voltage difference Vd between a first input terminal 108 and a second input terminal 109. The first input terminal 108 may correspond to terminal 108 in FIG. 2. An output terminal 107 may correspond to terminal 107 in FIG. 2. For example, the first input terminal 108 may be coupled to the switch 104 (FIG. 2), the switch 218, the capacitor C2a, and the capacitor C2b when implemented in the ADC circuit 200 (FIG. 2). Further, the output terminal 107 may be coupled to the switch 210, the switch 218, and the switch 222 when implemented in the ADC circuit 200, where the capacitor C2a and the capacitor C2b can be coupled via the switches to provide negative-feedback from the output terminal 107 to the first input terminal 108 in accordance with the described phases, and the load capacitor C3a and the load capacitor C3b may be charged in accordance with the described phases. The current Igm=gm·Vd may flow via a capacitor CC, which may be coupled to provide negative feedback for the second amplifier stage 302. Negative feedback provided by capacitor CC may reduce an output impedance of the second amplifier stage 302 by a large factor. In accordance with having a low output impedance, the second amplifier stage 302 may be modeled as a voltage-in-voltage-out amplifier circuit having a negative factor of voltage gain. PHOSITA are familiar with the theory, design, and implementation of many types of amplifier circuits, including amplifier circuits that may be reasonably modeled as a two-stage amplifier circuit 300 of FIG. 3a.

Consider again ADC circuit 200 of FIG. 2 wherein amplifier circuit 102 may be implemented as amplifier circuit 300 of FIG. 3a. A time constant t for a linear settling operation of amplifier circuit 102 in a negative-feedback configuration may be dependent on a transconductance gm of the first amplifier stage 301, a capacitance CC of capacitor CC, and a feedback factor for the negative-feedback configuration of amplifier circuit 102. A first feedback factor Ba (for the first phase of operation φ2a) may depend on the first feedback capacitor C2a and capacitor C1. A second feedback factor Bb (for the second phase of operation φ2b) may depend on the second feedback capacitor C2b and capacitor C1. In an embodiment, a transconductance gm of the first stage 301, a capacitance CC of capacitor CC, and a capacitance C1 of capacitor C1 may be nominally constant during operation. A change from phase φ2a to phase φ2b in a value for a time constant for a linear settling operation may be responsive to switching from the first feedback capacitor C2a in phase φ2a to the second feedback capacitor C2b in phase φ2b. For example, C2b may be substantially smaller than C2a (for example, C2b≈C2a/16), and a second feedback factor Bb may be smaller than a first feedback factor Ba. By choosing C2b less than C2a, a time constant may be relatively larger in phase φ2b compared to phase φ2a.

Amplifier circuit 102 may be configured to start the second phase of operation φ2b from a predefined initial state, such as 0V. If amplifier circuit 102 is implemented as two-stage amplifier circuit 300 of FIG. 3a, an initial state for a second phase of operation φ2b may depend on an operation of amplifier circuit 102 during the first phase of operation φ2a. For example, a charge on capacitor CC may be not reset between phase φ2a and phase φ2b. FIG. 3b shows an amplifier circuit 310 that may be a variation of amplifier circuit 300 of FIG. 3a. Amplifier circuit 310 may include a switch 304 coupled across capacitor CC to reset it between phase φ2a and phase φ2b. Timing diagram of FIG. 2 may be modified to include a control signal for controlling switch 304 so that it will be closed for a period of time (for example, 20 nanoseconds (ns)) between phase φ2a and phase φ2b (not shown).

Numerous variations of the present teaching are conceived. For example, amplifier circuit 102 of FIG. 2 may be implemented as amplifier circuit 310 of FIG. 3b including switch 304, and switch 218 and switch 104 in FIG. 2 may be removed. Specifically, switch 304 may be closed except when control signal φ2a=1 or control signal φ2b=1. A control signal for switch 304 may be a NOR-type combination of control signal φ2a and control signal φ2b. A duration from a falling edge of control signal φ2a to a rising edge of control signal φ2b may be sufficient (for example, 20 ns) to substantially reset capacitor CC to a predefined state. Switch 104 may be substituted by a short (a wire-type connection) and switch 218 may be substituted by an open (no connection). Feedback capacitor C2a and feedback capacitor C2b may be reset to a predetermined initial state (for example, 0V) by switch 103, switch 214, and switch 216 during phase φ1. Amplifier circuit 102 (implemented as amplifier circuit 310 in FIG. 3b) may start each phase of operation (phase φ2a and phase φ2b) from a substantially predefined initial state (for example, 0V across capacitor CC in FIG. 3b).

Switch 220 and switch 216 in FIG. 2 may be substituted by a single switch controlled by a timing control signal that may be derived from timing control signal φ1 and timing control signal φ2a. Alternatively, switch 220 may be removed, and terminal 226 may be substantially floating during phase φ2a.

Figure 4:
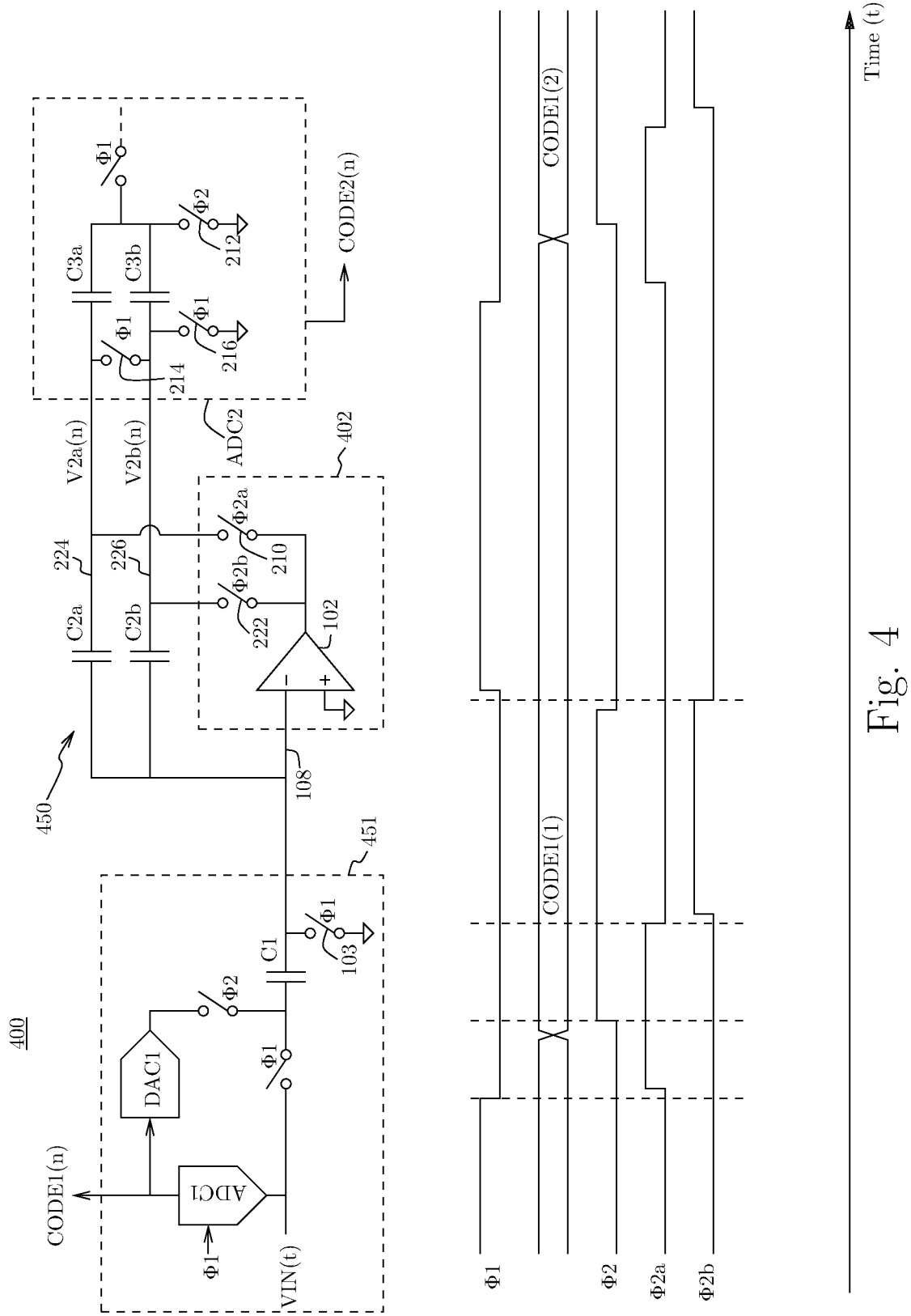
FIG. 4 shows an example ADC circuit and corresponding timing diagram that may be a variation of ADC circuit of FIG. 2, according to various embodiments.

FIG. 4 shows an ADC circuit 400 that may be a variation of ADC circuit 200 in FIG. 2. Switch 104, switch 218, and switch 220 in ADC circuit 200 have been removed in ADC 400 as described above. Furthermore, switch 210 and switch 222 in FIG. 2 have been moved to a composite circuit block 402 comprising amplifier circuit 102, and switch 210 and switch 222. Composite circuit block 402 may be connected via three terminals (terminal 108, terminal 224, and terminal 226) not counting timing control signals, power supplies, et cetera. Numerous variations of composite circuit block 402 are envisioned. An internal structure of block 402 shown in FIG. 4 may be one of several variations.

FIG. 3c shows an example composite circuit 320 that may be an implementation of block 402 in FIG. 4. It may comprise a two-stage amplifier circuit similar to FIG. 3a. Terminal 108, terminal 224, and terminal 226 in FIG. 3c may correspond to terminal 108, terminal 224, and terminal 226 in FIG. 4, respectively. For example, terminal 108 may be coupled to switch 103, capacitor C1, capacitor C2a, and capacitor C2b when implemented as block 402 in FIG. 4. Further, terminal 224 may be coupled between feedback capacitor C2a and load capacitor C3a, and terminal 226 may be coupled between feedback capacitor C2b and load capacitor C3b. The feedback capacitor C2a and the feedback capacitor C2b may provide negative feedback from terminal 224 to terminal 108, and from terminal 226 to terminal 108 in accordance with the described phases. Further, the load capacitor C3a and the load capacitor C3b may be charged in accordance with the described phases. Terminal 109 may be connected to ground, 0V. Capacitor CC in FIG. 3a may be substituted by a first capacitor CCa connected to terminal 224 and a second capacitor CCb connected to terminal 226 in the composite circuit 320 in FIG. 3c. Switch 210 and switch 222 in FIG. 3c may correspond to switch 210 and switch 222 in FIG. 4. During phase φ1, capacitor CCa and capacitor CCb may be reset to an initial state for which terminal 224 and terminal 226 may be biased at a predefined potential (for example, 0V) via switch 214 and switch 216. A switch 321 in FIG. 3c may provide negative feedback for the second amplifier stage 302 during phase φ1. A voltage at an input of the second amplifier stage 302 during phase φ1 may be, but need not be, 0V. For example, in an embodiment, an active element of the second amplifier stage 302 may be a MOS transistor configured in a common-source configuration with a gate terminal connected to capacitor CCa and capacitor CCb at an input of the second amplifier stage 302. In that case, a voltage at an input of the second amplifier stage 302 during phase φ1 may depend on a gate-source voltage of the MOS transistor and a supply voltage (for example, −3V). A time constant for a linear settling operation during phase φ2a may be dependent on transconductance gm, capacitor CCa, capacitor C1, and capacitor C2a. A time constant for a linear settling operation during phase φ2b may be dependent on transconductance gm, capacitor CCb, capacitor C1, and capacitor C2b. A duration from a falling edge of control signal φ2a to a rising edge of control signal φ2b may be a short delay, such as 200 ps.

FIG. 3d shows another example composite circuit 330 that may be an implementation of block 402 in FIG. 4. Terminal 108, terminal 224, and terminal 226 in FIG. 3d may correspond to terminal 108, terminal 224, and terminal 226 in FIG. 4, respectively. For example, terminal 108 may be coupled to switch 103, capacitor C1, capacitor C2a, and capacitor C2b when implemented as block 402 in FIG. 4. Further, terminal 224 may be coupled between feedback capacitor C2a and load capacitor C3a, and terminal 226 may be coupled between feedback capacitor C2b and load capacitor C3b. The feedback capacitor C2a and the feedback capacitor C2b may provide negative feedback from terminal 224 to terminal 108, and from terminal 226 to terminal 108 in accordance with the described phases. Further, the load capacitor C3a and the load capacitor C3b may be charged in accordance with the described phases. Terminal 109 may be connected to ground, 0V. An amplifier circuit 102 (FIG. 4) may be implemented as a transconductance circuit 331. So-called cascoding (telescopic-cascode, folded-cascode, regulated-cascode, et cetera) circuit techniques may be used to increase an output impedance of transconductance circuit 331, which may be beneficial to improve an accuracy of switched-capacitor circuit 450 (FIG. 4). PHOSITA know how to implement transconductance circuits including cascoding techniques for switched-capacitor circuits. A factor of transconductance gm may be selected to achieve a high degree of settling during a first phase of operation φ2a when transconductance circuit 331 may be connected to terminal 224 via switch 210. Transconductance circuit 331 may be connected to terminal 226 via switch 222 during a second phase of operation φ2b. A capacitor CC connected to terminal 226 may be provided to increase a settling time constant during phase φ2b. Capacitor CC may be provided to reduce a noise bandwidth and a noise level of switched-capacitor circuit 450 (FIG. 4). An optional switch 337 may be provided to conduct a current Igm from transconductance circuit 331 during phase φ1. Alternatively, switch 337 may be omitted and transconductance circuit 331 may be configured to provide an auto-zeroing operation in phase φ1. A polarity of transconductance gm may be selected to provide a negative-feedback configuration during the first phase of operation φ2a. In an embodiment, second feedback capacitor C3b (FIG. 4) may be nominally zero, and amplifier circuit 102 (transconductance circuit 331) may be configured to operate in a substantially open-loop configuration during phase φ2b. A duration from a falling edge of timing control signal φ2a to a rising edge of timing control signal φ2b may be a short delay, such as 200 ps.

Figure 6A:
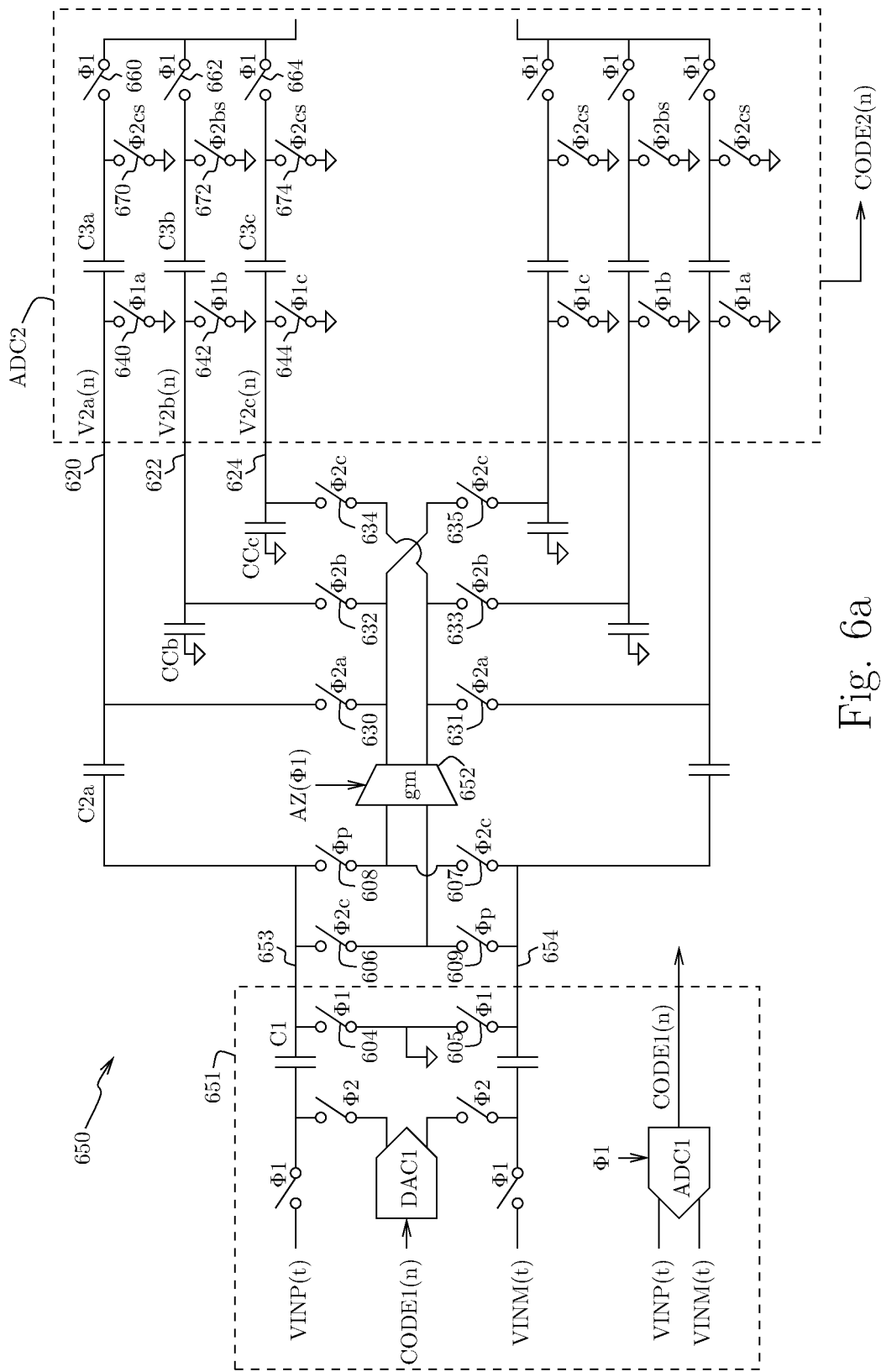
FIG. 6a shows another example circuit of the present teaching.

FIG. 3e shows yet another example composite circuit 340 that may be an implementation of block 402 in FIG. 4. Terminal 108, terminal 224, and terminal 226 in FIG. 3e may correspond to terminal 108, terminal 224, and terminal 226 in FIG. 4, respectively. For example, terminal 108 may be coupled to switch 103, capacitor C1, capacitor C2a, and capacitor C2b when implemented as block 402. Further, terminal 224 may be coupled between feedback capacitor C2a and load capacitor C3a, and terminal 226 may be coupled between feedback capacitor C2b and load capacitor C3b. The feedback capacitor C2a and the feedback capacitor C2b may provide negative feedback from terminal 224 to terminal 108, and from terminal 226 to terminal 108 in accordance with the described phases, and the load capacitor C3a and the load capacitor C3b may be charged in accordance with the described phases. Terminal 109 may be connected to ground, 0V. Composite circuit 340 may be a modification of composite circuit 320 of FIG. 3c. Composite circuit 320 (FIG. 3c) and composite circuit 340 (FIG. 3e) may operate in a similar manner during phase φ1 and phase φ2a. An operation of composite circuit 340 may be different during a second phase of operation φ2b than the operation of the composite circuit 320 during its second phase of operation φ2b. Specifically, terminal 226 may be connected to an output of the first amplifier stage 301 via a switch 343 during the second phase of operation φ2b, rather than to an output of the second amplifier stage 302 as in FIG. 3c. Second amplifier stage 302 may provide a change of polarity. A polarity may be changed (as indicated by symbol 344) during phase φ2b to align polarities of operation during phase φ2a and phase φ2b. In a fully differential implementation of ADC circuit 400 (FIG. 4) and composite circuit 340, a polarity may be changed by interchanging nodes for a fully differential signal (this concept is illustrated in FIG. 6a, described later). Each embodiment described herein may be implemented as a fully differential circuit, and each fully differential implementation may be an embodiment. PHOSITA know how to translate/modify a single-ended circuit to a fully differential variation thereof. Symbol 344 in FIG. 3e may represent a change of polarity, which may be provided by interchanging nodes in a fully differential variation of composite circuit 340. A switch 341 may connect an output of the first amplifier stage 301 to an input of the second amplifier stage 302 during phase φ2a. A switch 342 may be configured to conduct/deflect a current during phase φ1. Switch 342 may be combined with switch 341. Alternatively, switch 342 may be omitted, and first amplifier stage 301 may be configured to provide an auto-zeroing operation in phase φ1. A duration from a falling edge of control signal φ2a to a rising edge of control signal φ2b may be a short delay, such as 200 ps.

In another embodiment, a composite circuit similar to composite circuit 340 of FIG. 3e may operate as a single-ended circuit. A first amplifier stage 301 in FIG. 3e may be a fully differential transconductance circuit. A first output of the fully differential transconductance circuit may provide a current Igm via switch 341 and/or switch 342 to the input of second amplifier stage 302 as shown in FIG. 3e. A second output of the fully differential transconductance circuit may provide an opposite-polarity current (−Igm) to terminal 226 via switch 343 during the second phase of operation φ2b. Symbol 344 may represent that switch 343 is connected to the second output (as opposed to the first output) of the fully differential transconductance circuit, thus changing a polarity of a current provided to terminal 226 during phase φ2b.

In another embodiment, composite circuit 340 of FIG. 3e may comprise a capacitor CC (not shown) connected to terminal 226 to increase a time constant for a linear settling operation during phase φ2b. Alternatively, or in combination with, switch 343 may connect terminal 226 to an output of the first amplifier stage 301 that may provide a relatively smaller transconductance (for example, gm/16) during phase φ2b compared to a transconductance (for example, gm) that stage 301 may provide during phase φ2a.

In another embodiment, switch 222 in FIG. 2 may be substituted by a wire-type connection (always on), and switch 220 and switch 216 may be removed (always off). Other embodiments described herein may provide a relatively better robustness to variation of a gain factor (for example, caused by variation of environmental factors) during phase φ2b, but this embodiment may provide other advantages, such as a reduced circuit complexity.

Figure 5A:
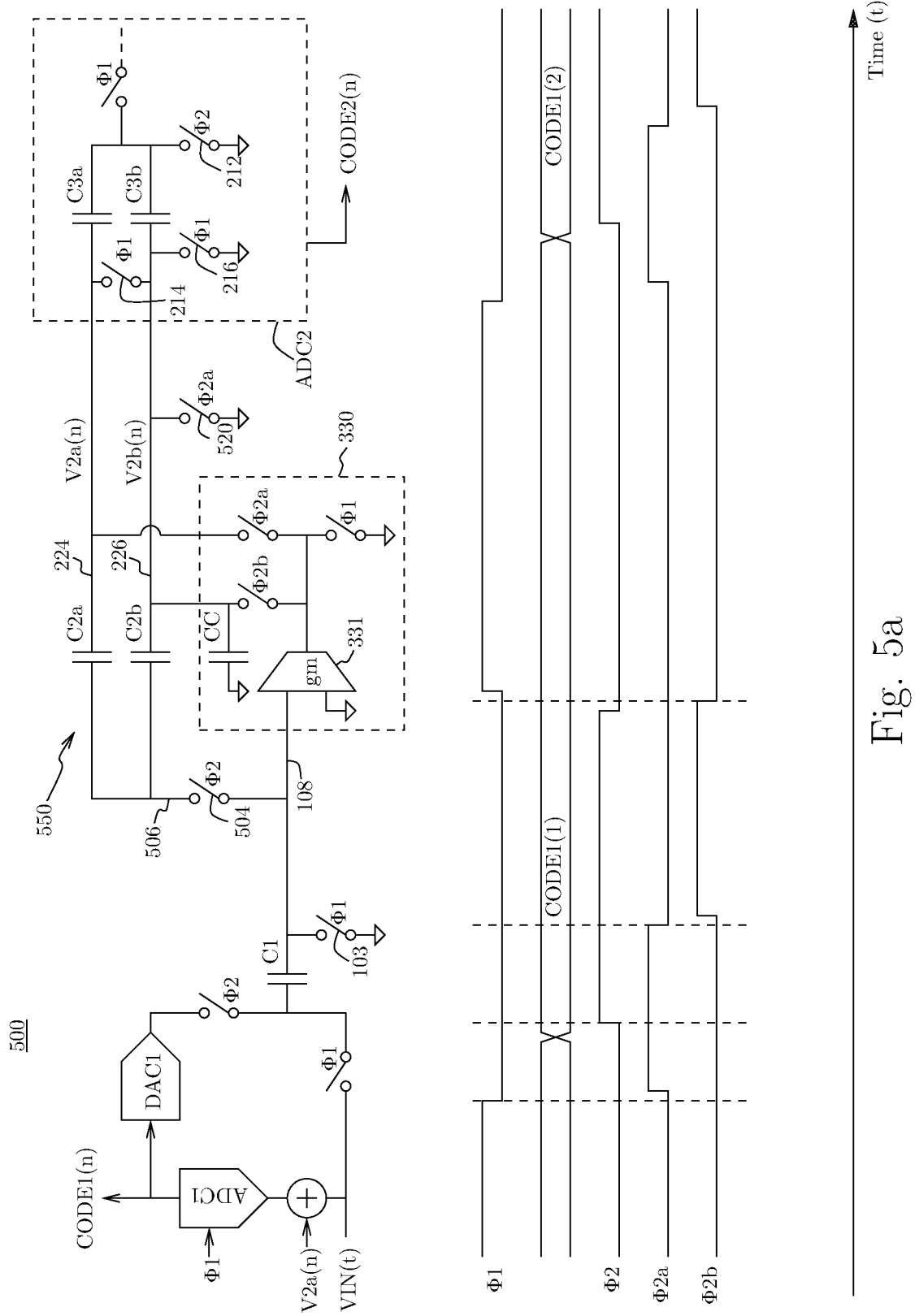
FIG. 5a shows an example ADC circuit and corresponding timing diagram, according to various embodiments.

FIG. 5a shows an example ADC circuit 500. It comprises a switched-capacitor circuit 550 that may be another embodiment of the present teaching. Similar to ADC 400 circuit (FIG. 4) described herein, an input signal may be a quantity of charge $Q1(n)=C1\cdot(VREF\cdot CODE1(n)-V1(n))=(-C1\cdot R1(n))$ nominally transferred via switch 504 during phase φ2. Switched-capacitor circuit 550 may be configured as an integrating circuit, and $CODE2(n)$ may substantially represent a running sum of residue values $R1(n)$. A digital circuit (not shown) may derive an output code $DOUT(n)=CODE1(n)+CODE2(n)-CODE2(n-1)$ to represent a sampled value $V1(n)$ of VIN(t). A difference operation, $CODE2(n)-CODE2(n-1)$, may be an inverse of a running sum (accumulate) operation provided by switched-capacitor circuit 550. A value derived from a running sum of $R1(n)$ may be configured to induce an offset for ADC1, which may prevent switched-capacitor circuit 550 and/or ADC2 from saturating. For example, an offset of ADC1 may be controlled by $V2a(n)$ or $CODE2(n)$. PHOSITA will recognize that ADC 500 may be an oversampling-type ADC (delta-sigma, sigma-delta, noise-shaping, mismatch-shaping, et cetera), that DAC1 may be configured to provide dynamic-element-matching (DEM), that switched-capacitor circuit 550 may be substituted by a filter of any order (for example, it may comprise any number of integrating circuits), and that ADC 500 may be modified to include various kinds of dithering techniques (including, but not limited to, dithering techniques described in U.S. Pat. Nos. 8,810,443, 9,054,727, 9,231,611, and 9,331,709). ADC 500 may be an example of a system incorporating a signal-processing switched-capacitor circuit 550 for which an output value (for example, a running sum $V2(n)=R1(n)+V2(n-1)$) is derived from an input value $R1(n)$ in a signal-processing operation that combines the input value $R1(n)$ with an output value from a previous cycle of operation $V2(n-1)$.

Switch 504 may be open and an amount of charge on node 506 may be substantially isolated except during phase φ2. Charge transferred via switch 504 in each phase φ2 may be accumulated on node 506. Unlike an amplifier circuit (for example, switched-capacitor circuit 450 in FIG. 4), feedback capacitor C2a and feedback capacitor C2b may be not reset to a predefined state in each cycle of operation. A composite circuit block 330 including an amplifier circuit 331 has been already described (FIG. 3d), including how it may be incorporated in a switched-capacitor circuit 450 as block 402 in FIG. 4. Switched-capacitor circuit 450 (FIG. 4) and switched-capacitor circuit 550 (FIG. 5a) may be very similar. They may differ with respect to switches 504 and 520, which may be included only in circuit 550 of FIG. 5a. Switch 504 may serve to prevent feedback capacitor C2a and feedback capacitor C2b from being reset during phase φ1. Switch 520 may be compared to switch 220 of FIG. 2, and it may be combined with switch 216 as described earlier.

In a first phase of operation φ2a, a charge that may have been stored (for example, not reset during phase φ1) on the second feedback capacitor C2b may be nominally transferred to the first feedback capacitor C2a. Accordingly, feedback capacitor C2b may transition to a predefined state (for example, 0V) during phase φ2a. An input quantity of charge $Q1(n)=C1\cdot(VREF\cdot CODE1(n)-V1(n))=(-C1\cdot R1(n))$ may be also nominally transferred to the first feedback capacitor C2a during phase φ2a. Amplifier circuit 331 may be configured to provide a high degree of settling (for example, P>6) during the first phase of operation φ2a. A fully settled voltage on node 224 may be representative of a charge on feedback capacitor C2a (for example, a running sum of $Q1(n)$). A quantity of charge shared by the first feedback capacitor C2a and load capacitor C3a may be substantially constant (for example, substantially isolated) during a second phase of operation φ2b. Further, a quantity of charge on the first feedback capacitor C2a may be substantially constant during the second phase of operation φ2b. An operation of switched-capacitor circuit 550 during phase φ2b may be similar or identical to an already-described operation of a switched-capacitor circuit 250 in FIG. 2 and/or switched-capacitor circuit 450 in FIG. 4. For example, amplifier circuit 331 may be configured to provide a low degree of settling to keep a noise bandwidth and a noise level low during phase φ2b. A second quantity of charge sampled on the second load capacitor C3b may be combined with a first quantity of charge sampled on the first load capacitor C3a to substantially cancel a first error $C3a\cdot N2a(n)$, which may be (but need not be) a noise-like error. A ratio of load capacitors C3b/C3a may be larger (for example, it may be 10 percent larger) than a ratio of feedback capacitors C2b/C2a. A relatively larger value of C3b/C3a compared to C2b/C2a may be selected to compensate for an incomplete settling of amplifier circuit 331 during phase φ2b. An incomplete settling of amplifier circuit 331 may reflect that node 108 has not yet reached a target value (for example, 0V corresponding to a virtual short), and that a charge on node 506 may include an error that may depend on a deviation $N2a(n)$ included in $V2a(n)$. An incomplete settling of terminal 108 may be not detrimental to a switched-capacitor amplifier circuit (for example, circuit 250 in FIG. 2 and circuit 450 in FIG. 4), because capacitor C1, capacitor C2a, and capacitor C2b may be reset in a subsequent phase φ1. However, an incomplete settling that may cause an error to an accumulated charge (for example, a charge quantity on node 506) may be detrimental to an operation of an integrating circuit, such as switched-capacitor circuit 550 of FIG. 5a.

Figure 5B:
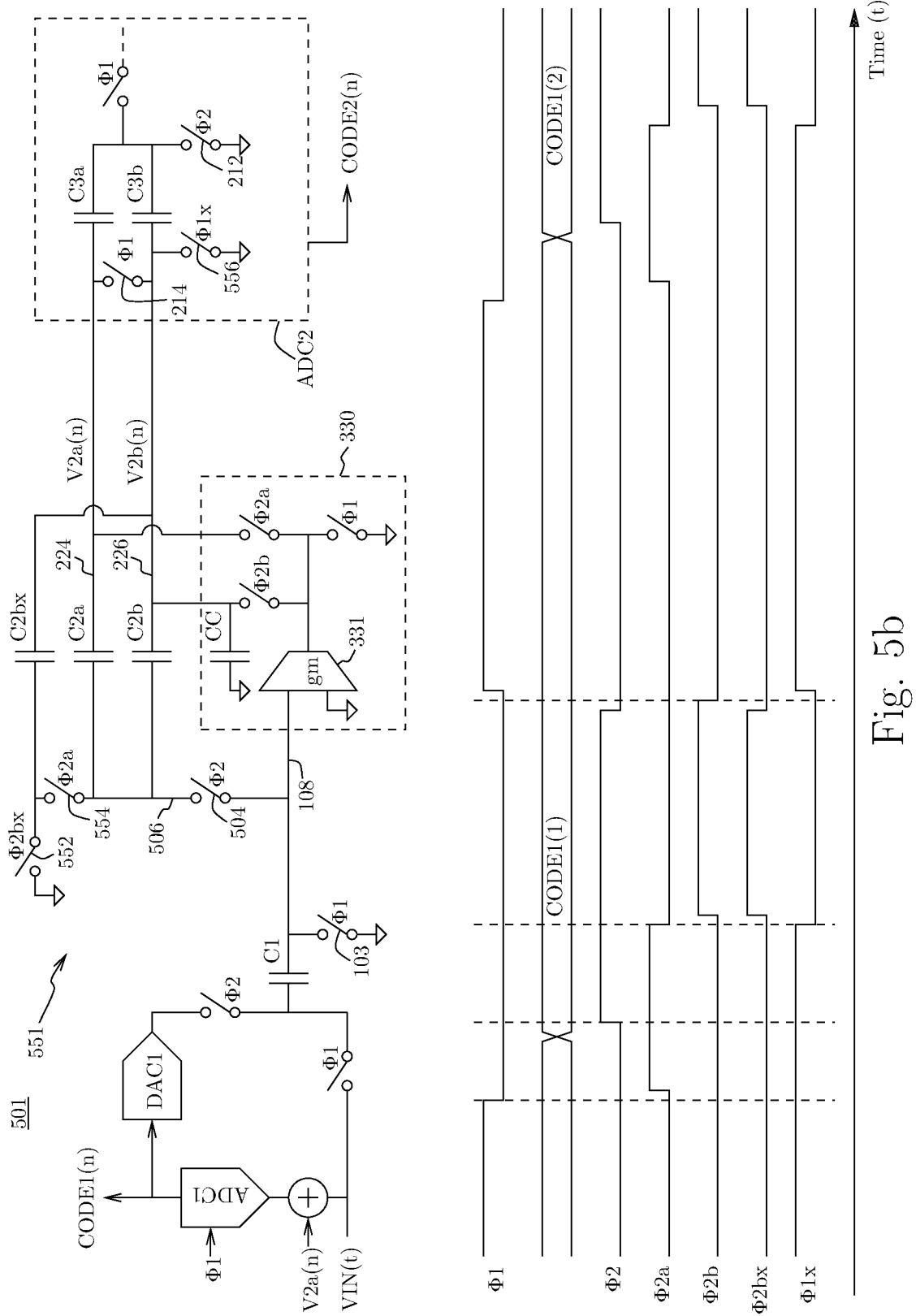
FIG. 5b shows an example ADC circuit and corresponding timing diagram that may be a modification of ADC circuit of FIG. 5a, according to various embodiments.

FIG. 5b shows an ADC circuit 501 that may be a modification of ADC circuit 500 in FIG. 5a. Specifically, a switched-capacitor circuit 551 in FIG. 5b may be a modification of switched-capacitor circuit 550 in FIG. 5a. Switched-capacitor circuit 551 may be configured to substantially correct/compensate a charge on node 506 for an error that may be otherwise caused by an incomplete settling of amplifier circuit 331 during phase φ2b. Switched-capacitor circuit 551 includes a capacitor C2bx that may be configured to sample a voltage at terminal 226 substantially at a falling edge of control signal φ2 when switch 504 opens.

A switch 552 may be controlled by a timing control signal φ2bx that may have a rising edge substantially aligned with a rising edge of control signal φ2b and a falling edge substantially aligned with a falling edge of control signal φ2. FIG. 5b includes a timing diagram for timing control signal φ2bx. A quantity of charge sampled on capacitor C2bx may be nominally equal to a charge error on node 506 when switch 504 opens. The quantity of charge sampled on capacitor C2bx may be nominally transferred to the first feedback capacitor C2a (nominally cancelling the error charge) in a subsequent phase φ2a via a switch 554. FIG. 5b further shows that switch 216 and switch 520 in FIG. 5a can be combined and substituted by a single switch 556. FIG. 5b includes a timing diagram for a control signal φ1x that may be used to control switch 556. Second feedback capacitor C2b may be omitted, and amplifier circuit 331 may operate in a substantially open-loop configuration during phase φ2b.

FIG. 6a shows another embodiment of the present teaching. It may be configured to substantially cancel an offset error while providing low-noise, low-power signal processing. Specifically, it may provide a second-level auto-zeroing operation for an offset error after (in addition to) a first-level offset auto-zeroing operation that amplifier 652 may be configured to provide in phase φ1. It is a fully differential switched-capacitor circuit 650 that may be used as a substitute for a fully differential variant of circuit 450 in FIG. 4. An operation of a fully differential circuit may be described with respect to a half-circuit thereof. For example, an operation of switched-capacitor circuit 650 may be described with respect to an upper/positive half of the circuit 650. It should be understood that the operation of the lower/negative half of the circuit 650 may be similar to the operation of the upper/positive half of the circuit 650, with the difference being that the lower/negative half of the circuit 650 operates on the other line of a differential from the upper/positive half of the circuit 650 during a same phase. In other words, the lower/negative half of the circuit 650 operates on an opposite-polarity half of a fully differential signal compared to the upper/positive half of the circuit 650. Switched-capacitor half-circuit 650 of FIG. 6a may be compared to (and it may be interchangeable with) single-ended switched-capacitor circuit 450 of FIG. 4. PHOSITA will recognize that a polarity may be changed by, for example, switch 634 and switch 635 connecting to an opposite-half of amplifier circuit 652 (in other words, connecting from an upper/positive half to a lower/negative half of the circuit 650, and vice versa). Compare switch 634 to switch 343 and symbol 344 in FIG. 3e. PHOSITA will further recognize that it is well known and conventional that a fully differential amplifier circuit 652 may include (implicit, not shown) circuitry for regulating a common-mode voltage level.

An input circuit 651 in FIG. 6a may have similar features to an input circuit 451 in FIG. 4. As described earlier, a residue $R1(n)$ of a sampled voltage $V1(n)$ with respect to a $CODE1(n)$ and VREF may be represented by a quantity of charge $Q1(n)=C1\cdot(VREF\cdot CODE1(n)-V1(n))=(-C1\cdot R1(n))$ that may be nominally transferred via a wire 653 during phase φ2. In a half-circuit representation, sampled voltage $V1(n)$ may be a half of a fully differential voltage VINP(t)−VINM(t) sampled at a sampling instant when switch 604 and switch 605 open. In one example, compare FIG. 4 and FIG. 6a for VIN(t)=VINP(t)=−VINM(t).

Switched-capacitor circuit 650 may include a load circuit that may be comprised in a quantizer circuit ADC2. A positive-half load circuit may include a first load capacitor C3a, a second load capacitor C3b, and a third load capacitor C3c. An output value provided to ADC2 may be a combination of a first quantity of charge sampled on the first load capacitor C3a when switch 670 opens, a second quantity of charge sampled on the second load capacitor C3b when switch 672 opens, and a third quantity of charge sampled on the third load capacitor C3c when switch 674 opens. The first, second, and third quantities of charge may be combined when switch 640, switch 642, switch 644, switch 660, switch 662, and switch 664 close in phase φ1. Accordingly, a load circuit may comprise more-than-two load capacitors, and an output value may be a combination of more-than-two quantities of charge sampled on more-than-two load capacitors. In another embodiment, a load circuit may comprise four-or-more load capacitors, and an output value may be a combination of four-or-more quantities of charge sampled on four-or-more load capacitors.

Figure 6B:
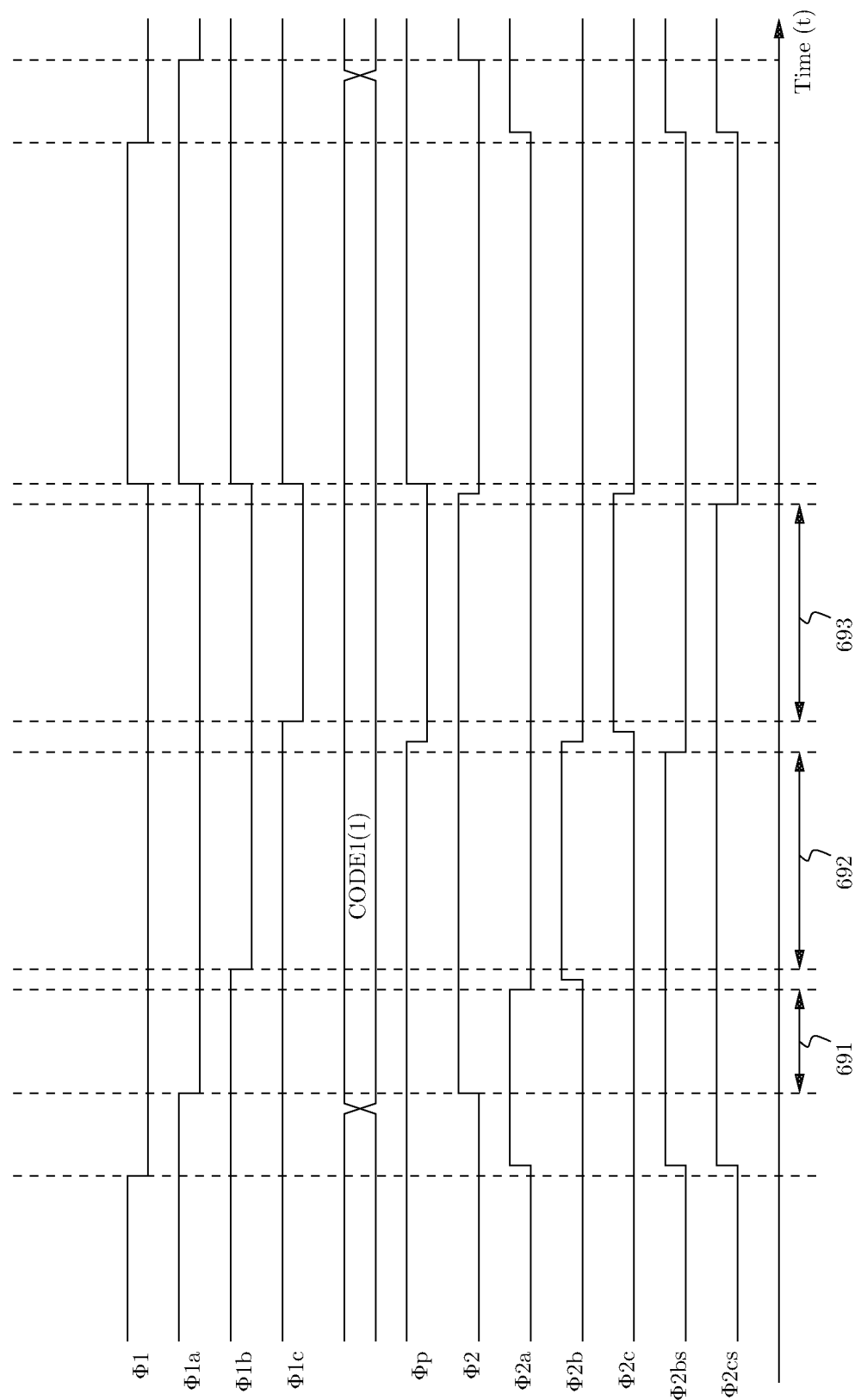
FIG. 6b shows an example timing diagram for the circuit of FIG. 6a, according to various embodiments.

FIG. 6b shows an example timing diagram for circuit 650 of FIG. 6a. It includes several timing control signals: timing control signal φ1, timing control signal φ1a, timing control signal φ1b, timing control signal φ1c, timing control signal φp, timing control signal φ2, timing control signal φ2a, timing control signal φ2b, timing control signal φ2c, timing control signal φ2bs, and timing control signal φ2cs. Switched-capacitor circuit 650 may charge each load capacitor in a separate phase of operation during phase φ2. For example, a first load capacitor C3a may be charged in a first phase of operation 691, a second load capacitor C3b may be charged in a second phase of operation 692, and a third load capacitor C3c may be charged in a third phase of operation 693. A phase of operation may be characterized by a logical combination of several timing control signals. For example, a first phase of operation 691 may be characterized by [NOT(φ1a) AND φ2a]. A second phase of operation 692 may be characterized by [NOT(φ1b) AND φ2bs]. A third phase of operation 693 may be characterized by [NOT(φ1c) AND φ2cs].

Switch 608 and a first switch 630 may be closed during a first phase of operation 691 to configure a first feedback capacitor C2a and an amplifier circuit 652 in a negative-feedback configuration. Amplifier circuit 652 may be a transconductance circuit configured to provide a large degree of settling (for example, P>6) during the first phase of operation 691. An input quantity of charge $Q1(n)=(-C1 \cdot R1(n))$ may be nominally transferred to capacitor C2a during the first phase of operation 691. An actual transfer of charge during the first phase of operation 691 may be a combination of $Q1(n)$, an error due to a potentially non-zero offset of amplifier 652, and other errors.

A quantity of charge shared by first feedback capacitor C2a and first load capacitor C3a may be substantially constant (for example, substantially isolated on node 620) during the second phase of operation 692 and third phase of operation 693, after switch 630 opens at a falling edge of control signal φ2a. A first error $N2a(n) \cdot C3a$ that may be included in a first quantity of charge on C3a may comprise an error due to a potentially non-zero offset of amplifier 652 and other errors. First load capacitor C3a may be coupled to an input of amplifier circuit 652 via first feedback capacitor C2a, and a representation of the first error may be observable at node 653. Subsequently, during the second phase of operation 692 and the third phase of operation 693, the second load capacitor C3b and the third load capacitor C3c may be charged with second and third quantities of charge, respectively. The first error may be nominally cancelled when the first, second, and third quantities of charge are combined in a subsequent phase φ1. For example, second, and third quantities of charge sampled on load capacitor C3b and load capacitor C3c, respectively, may nominally cancel a noise-like error comprised in the first error $N2a(n) \cdot C3a$ included in a value sampled on the first load capacitor C3a. Furthermore, second and third quantities of charge sampled on load capacitor C3b and load capacitor C3c, respectively, may nominally cancel an offset error comprised in the first error $N2a(n) \cdot C3a$. An offset error comprised in the first error $N2a(n) \cdot C3a$ may be cancelled primarily by the third quantity of charge sampled on the third load capacitor C3c, and relatively less so by the second quantity of charge sampled on the second load capacitor C3b. Circuit parameters may be selected to simultaneously nominally cancel an offset error and other errors comprised in the first error $N2a(n) \cdot C3a$.

Amplifier circuit 652 may operate in substantially open-loop configurations during the second phase of operation 692 and third phase of operation 693. A voltage V(653,654) between node 653 and node 654 (and charge stored on feedback capacitor C2a) may be substantially constant during phase 692 and phase 693. A non-zero voltage V(653,654) may reflect an imperfect transfer of charge during phase 691, for example, a deviation from a nominal value $Q1(n)=(-C1 \cdot R1(n))$.

A polarity of a transconductance from voltage V(653,654) to current accumulated on load capacitor C3a, load capacitor C3b, and load capacitor C3c may be maintained in the first phase of operation 691, the second phase of operation 692, and the third phase of operation 693. A magnitude of the transconductance may be effectively reduced in phase 692 and phase 693 by providing capacitor CCb and capacitor CCc (for example, to capacitively divide current and/or charge). Differential input and output terminals of amplifier circuit 652 may be crossed (by opening switch 608, switch 609, switch 632, and switch 633 and closing switch 606, switch 607, switch 634, and switch 635) during phase 693 to effectively change a polarity of an amplifier offset as it may be referred to node 653 and node 654, in other words, voltage V(653,654). Accordingly, an offset of amplifier circuit 652 referred to V(653,654) may be (+OFFSET(n)) during phase 691 and phase 692, and it may be (−OFFSET(n)) during phase 693.

A first error $N2a(n) \cdot C3a$ comprised in a first quantity of charge on the first load capacitor C3a may include an offset error and other errors. For a first step in an analysis, we may choose to consider the offset error alone and exclude other errors. An offset of amplifier circuit 652 referred to V(653, 654) may be substantially the same (+OFFSET(n)) in phase 692 as in phase 691, and amplifier circuit 652 may provide a nominally zero quantity of charge to the second load capacitor C3b during phase 692 (for example, when excluding other errors, amplifier circuit 652 may have settled fully in phase 691, and V(653,654) may correspond to an offset in phase 692). A polarity of the offset referred to V(653,654) may be changed in phase 693 compared to phase 691, and amplifier circuit 652 may provide a quantity of charge to the third load capacitor C3c that may be responsive to (−2·OFFSET(n)). Circuit parameters (including parameters related to, but not limited to, capacitor C1, capacitor C2a, capacitor CCb, capacitor CCc, capacitor C3a, capacitor C3b, capacitor C3c, transconductance gm, and/or durations of phase 691, phase 692, and phase 693) may be selected such that the quantities of charge sampled on capacitor C3b and capacitor C3c nominally cancel an offset error comprised in the first error $N2a(n) \cdot C3a$.

For a second step in the analysis, we may choose to exclude the offset error (in other words, we may set OFFSET=0), and consider only other errors comprised in the first error $N2a(n) \cdot C3a$. When OFFSET=0, the second phase of operation 692 and third phase of operation 693 may be functionally equivalent except for a scaling factor. In other words, when OFFSET=0, a second quantity of charge sampled on C3b may be nominally proportional to a third quantity of charge sampled on C3c. Combined (joined) second and third quantities of charge sampled on load capacitor C3b and load capacitor C3c, respectively may be compared to a quantity of charge sampled on capacitor C3b in FIG. 4. For example, phase 692 and phase 693 of circuit 650 in FIG. 6a may be jointly equivalent to the second phase of operation φ2b of circuit 450 in FIG. 4 wherein block 402 may be circuit 330 in FIG. 3d and capacitor C2b may be removed. Circuit 450 has been already described. Specifically, a first error N2a(n)·C3a excluding an offset error comprised in a first quantity of charge sampled on first load capacitor C3a in FIG. 4 may be substantially cancelled by a second quantity of charge sampled on second load capacitor C3b. Parameters for circuit 450 of FIG. 4 (including parameters related to, but not limited to, capacitor C1, capacitor C2a, capacitor CC, capacitor C3a, capacitor C3b, transconductance gm, and/or durations of phase φ2a and phase φ2b) may be selected to nominally cancel the first error N2a(n)·C3a excluding an offset error. By extension and/or equivalence, parameters for circuit 650 of FIG. 6a (including parameters related to, but not limited to, capacitor C1, capacitor C2a, capacitor CCb, capacitor CCc, capacitor C3a, capacitor C3b, capacitor C3c, transconductance gm, and/or durations of phase 691, phase 692, and phase 693) may be selected such that quantities of charge sampled on capacitor C3b and capacitor C3c nominally cancel a first error N2a(n)·C3a excluding an offset error.

The first and second steps of the analysis may be combined. An offset error comprised in the first error N2a(n)·C3a may be primarily cancelled by charge sampled on capacitor C3c. Non-offset errors comprised in the first error N2a(n)·C3a may be cancelled in a relatively proportional manner by charge sampled on capacitor C3b as well as on capacitor C3c. Parameters needed to cancel offset and non-offset errors may be substantially linearly independent. Accordingly, parameters for circuit 650 (including parameters related to, but not limited to, capacitor C1, capacitor C2a, capacitor CCb, capacitor CCc, capacitor C3a, capacitor C3b, capacitor C3c, transconductance gm, and/or durations of phase 691, phase 692, and phase 693) may be selected such that quantities of charge sampled on load capacitor C3b and load capacitor C3c combined nominally substantially cancel an offset error as well as non-offset errors that may be comprised in a first quantity of charge sampled on load capacitor C3a. In an embodiment, a capacitance of capacitor CCb may be nominally equal to a capacitance of capacitor CCc, a capacitance of capacitor C3b may be nominally equal to a capacitance of capacitor C3c, and phase 692 and phase 693 may be nominally of equal duration. Adjustments may be made to account for and/or to compensate for specific circumstances.

Variation of environmental factors may cause a first error N2a(n)·C3a to be not cancelled completely, but rather to be substantially suppressed. Substantial suppression (for example, by a factor of 10) in lieu of complete cancellation may be adequate for a noise-like first error N2a(n)·C3a. For example, a substantially suppressed noise-like first error may be considered insignificant compared to an overall error, which may include a noise-like second error. In an embodiment, amplifier circuit 652 may be configured to have a substantially noise-like offset OFFSET(n). To achieve that, amplifier circuit 652 may comprise circuitry to nominally auto-zero its offset during phase φ1. Switch 604, switch 605, switch 608, and switch 609 may be closed in phase φ1, and an input voltage to amplifier circuit 652 may be nominally zero in phase φ1. A control signal AZ(01) may configure amplifier circuit 652 to adjust an operating point (for example, by regulating an output voltage of amplifier circuit 652 while providing zero output current) for the zeroed input voltage. A bandwidth (for example, a noise bandwidth) of an auto-zeroing operation of amplifier circuit 652 may be relatively high, and a corresponding noise level may be also relatively high. However, a noise-like offset error caused by OFFSET(n) may be substantially suppressed (for example, by a factor of 10) by an auto-zeroing operation of circuit 650 when combining values derived in phase 691, phase 692, and phase 693. A resulting substantially suppressed noise-like offset error may be considered insignificant compared to an overall error for circuit 650, which may include a noise-like second error.

Figure 6C:
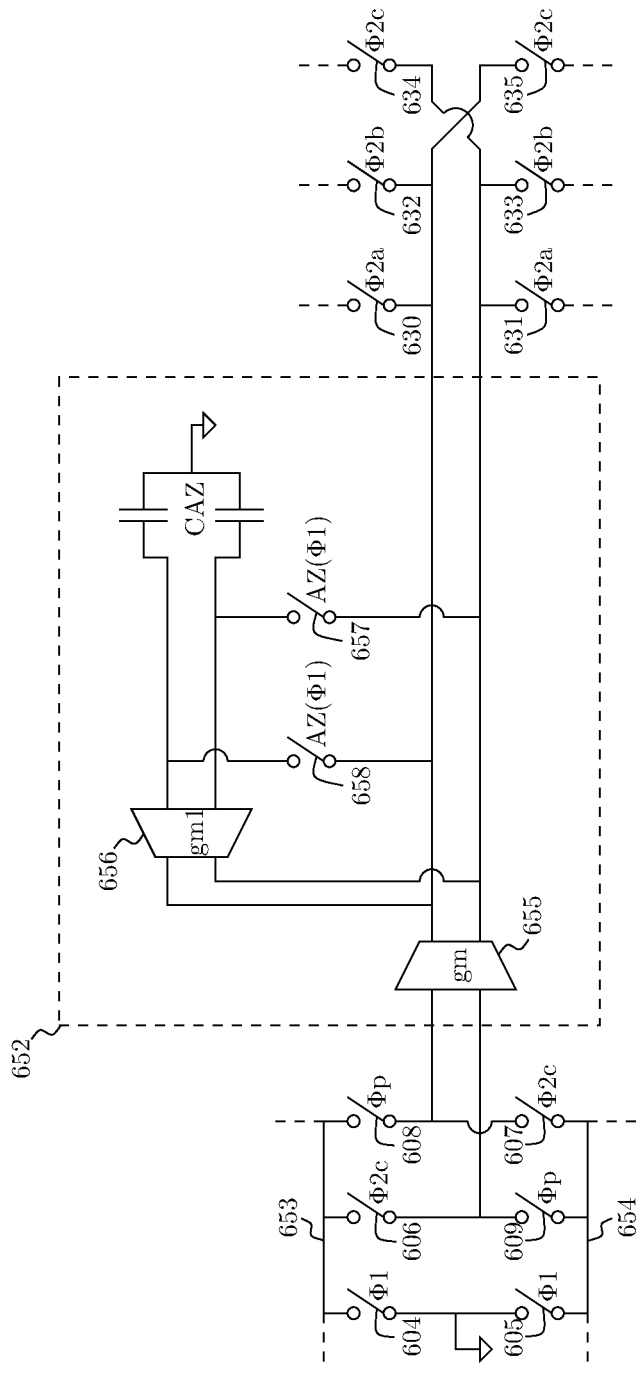
FIG. 6c shows a more detailed view of the amplifier circuit of FIG. 6a including an auto-zeroing operation, according to various embodiments.

FIG. 6c shows a more detailed view of amplifier circuit 652 of FIG. 6a including an auto-zeroing operation. A primary transconductance circuit 655 may provide a differential output current responsive to an input voltage. A secondary transconductance circuit 656 may provide an output current that may be combined with the output current of circuit 655 to provide an overall output current of transconductance circuit 652. Switch 657 and switch 658 may be closed during an auto-zeroing operation and open when either one of switch 630, switch 631, switch 632, switch 633, switch 634, and switch 635 are closed. In an embodiment, switch 657 and switch 658 may be closed during phase φ1. Circuit 656 may operate in a negative-feedback configuration during an auto-zeroing operation, and a voltage across capacitors CAZ may settle towards a target for which a combination of the output currents from transconductance circuit 655 and the transconductance circuit 656 may be zero (an input voltage to circuit 655 may be zero when switch 604, switch 605, switch 608, and switch 609 are closed). Capacitors CAZ and transconductance circuit 656 may be configured to provide a large degree of settling during the auto-zeroing operation. Accordingly, when switch 657 and switch 658 open at the end of an auto-zeroing operation, a nominal voltage across capacitors CAZ may correspond to a nominally zero offset of the overall transconductance circuit 652. In other words, a nominal operation of amplifier circuit 652 may correspond to OFFSET(n)=0. However, an actual voltage across capacitors CAZ may be subject to noise, and OFFSET(n) may be a noise-like sequence with a nominally zero mean value.

The described example auto-zeroing operation of amplifier circuit 652 may be adapted to provide an auto-zeroing operation for composite circuit 330 in FIG. 3d and FIG. 5b. If an auto-zeroed offset-noise level (for example, a rms value of OFFSET(n)) is sufficiently small for an application's requirements, then an auto-zeroing composite circuit 330 may be used as shown in FIG. 4 or FIG. 5b (for example, as a substitute for circuit block 402). However, an auto-zeroed offset-noise level may be too high for some applications. For such applications, a switched-capacitor circuit similar to circuit 650 of FIG. 6a may be used to further substantially suppress an error from an auto-zeroed amplifier offset OFFSET(n). Accordingly, an embodiment of the present teaching may provide both a first-level auto-zeroing operation (for example, auto-zeroing of amplifier circuit 652, shown in FIG. 6c) and a second-level auto-zeroing operation (for example, circuit 650 in FIG. 6a combining charge sampled on capacitor C3a, capacitor C3b, and capacitor C3c). In another embodiment, amplifier circuit 652 need not provide a first-level auto-zeroing operation, and an amplifier offset error may be substantially suppressed by circuit 650 combining charge sampled on capacitor C3a, capacitor C3b, and capacitor C3c.

Several variations are anticipated of circuit 650 providing low-noise auto-zeroing signal processing. In an embodiment, an auto-zeroing operation of amplifier circuit 652 (FIG. 6a, FIG. 6b, and FIG. 6c) may be active while ADC1 derives CODE1(n), for example between falling edges of control signal φ1 and rising edges of control signal φ2 (FIG. 6b). Rising edges of timing control signal φ2a may be delayed and aligned with rising edges of control signal φ2. One or more switches may be added (not shown) to provide zero input voltage for amplifier circuit 652 during the auto-zeroing operation. Amplifier circuit 652 may be in an off state or in another low-power mode during phase φ1 to reduce an overall power consumption.

In another embodiment, circuit 650 may be modified to include 4 phases of operation during phase φ2. A first pair of phases of operation may be equivalent to phase 691 and phase 692. During a second pair of phases of operation, amplifier circuit 652 may be configured to operate with a changed-polarity offset. The second pair of phases of operations may be similar to the first pair of phases of operation. For example, during a first phase of the second pair of phases of operation, amplifier circuit 652 may charge a load capacitor coupled to an amplifier input via a feedback capacitor.

In another embodiment, load capacitor C3b and/or load capacitor C3c may be coupled to an input of amplifier 652 (for example, node 653) via one or more feedback capacitors.

Figure 7A:
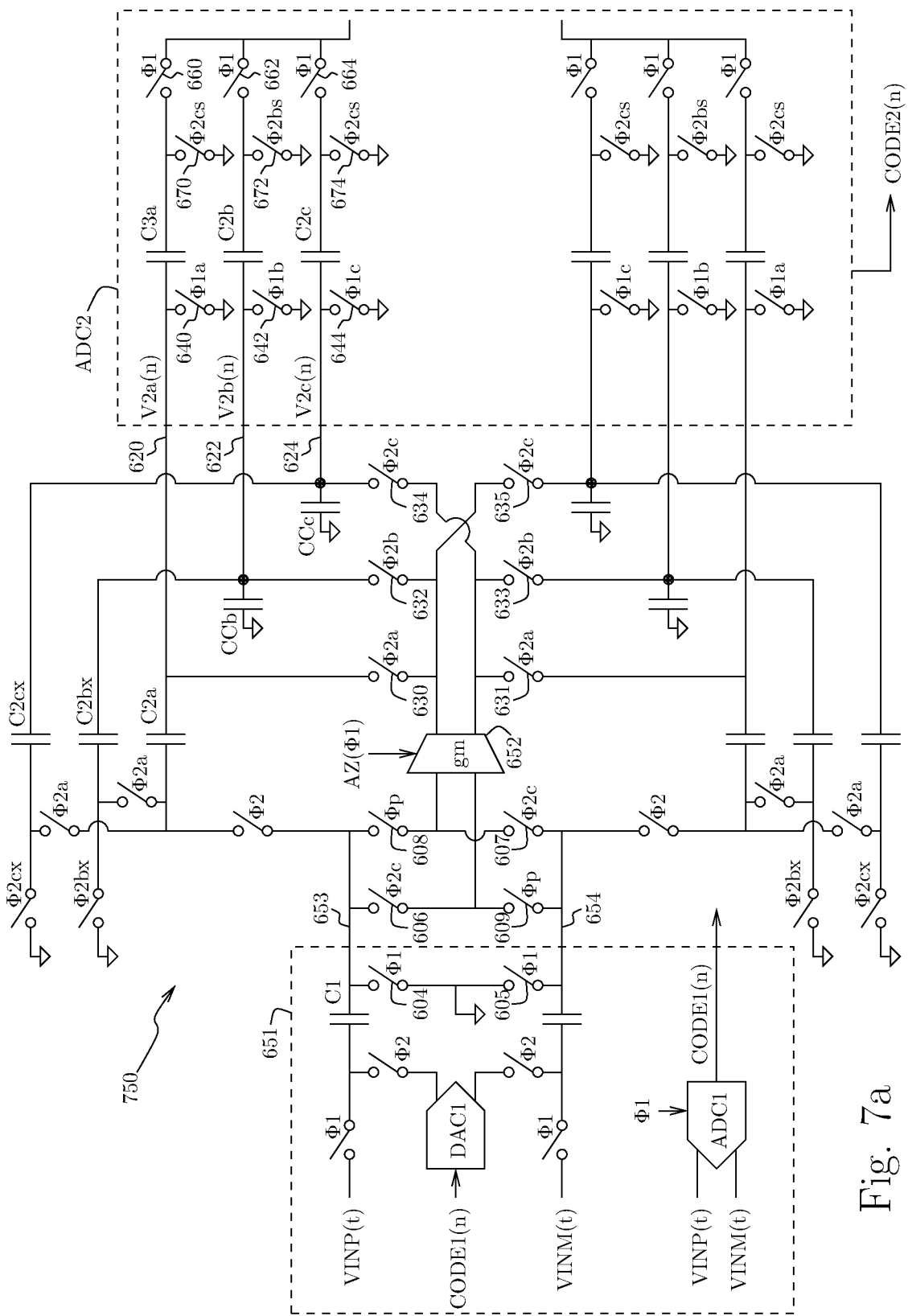
FIG. 7a shows an example integrating low-noise auto-zeroing switched-capacitor circuit that may be an extension or modification of the circuit of FIG. 6a, according to various embodiments.
Figure 7B:
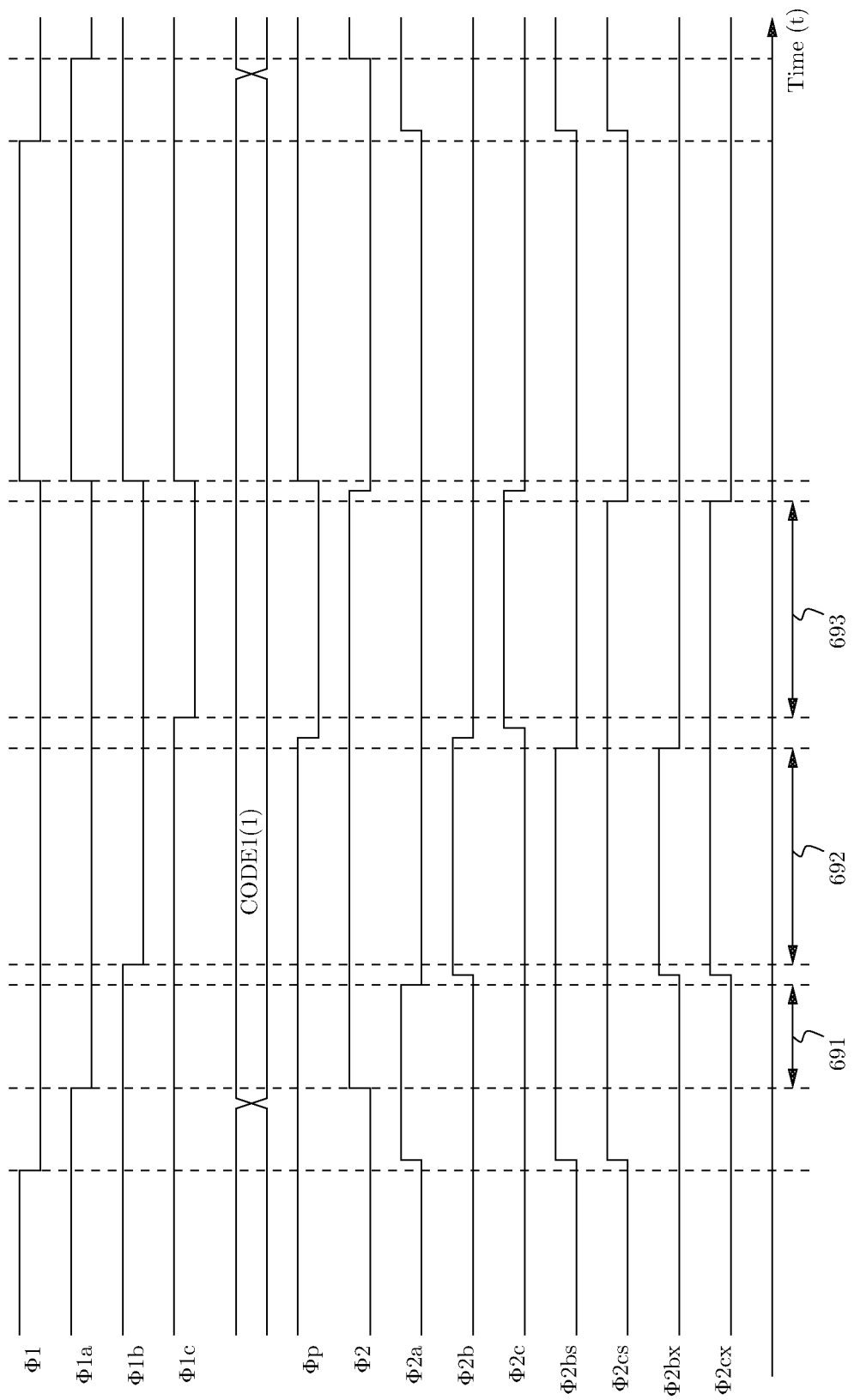
FIG. 7b shows an example timing diagram for the circuit of FIG. 7a, according to various embodiments.

In another embodiment, a variation of circuit 650 may be configured to operate as an integrating low-noise auto-zeroing switched-capacitor circuit (compare circuits 550 of FIGS. 5a and 551 of FIG. 5b to circuit 450 of FIG. 4). FIG. 7a shows an example integrating low-noise auto-zeroing switched-capacitor circuit 750 that may be an extension or modification of circuit 650 in FIG. 6a. FIG. 7b shows a timing diagram for circuit 750 that may include two timing control signals, timing control signal φ2bx and timing control signal φ2cx. Capacitor C2bx may sample a quantity of charge that may be nominally proportional to a quantity of charge sampled on the second load capacitor C3b at a falling edge of control signal φ2bx that may be substantially simultaneous with a falling edge of control signal φ2bs. Likewise, capacitor C2cx may sample a quantity of charge that may be nominally proportional to a quantity of charge sampled on the third load capacitor C3c at a falling edge of control signal φ2cx that may be substantially simultaneous with a falling edge of control signal φ2cs. Charge sampled on capacitor C2bx and capacitor C2cx may be transferred to feedback capacitor C2a during phase φ2a in an operation cycle with index (n+1) to substantially compensate for an error that may have occurred in phase φ2a of a previous operation cycle with index (n). Accordingly, an error may occur in a first phase of operation. A property of the error may be reflected by a voltage V(653,654) and an amplifier offset OFFSET(n). Charge sampled on each of capacitor C3b and/or capacitor C2bx may be derived by observing a first combination of V(653,654) and OFFSET(n) during a second phase of operation. Charge sampled on each of capacitor C3c and/or capacitor C2cx may be derived by observing a second combination of V(653,654) and OFFSET(n) during a third phase of operation. The first and second combinations of V(653,654) and OFFSET(n) may be substantially different. For example, a polarity of OFFSET(n) may be different in the first and second combinations of V(653,654) and OFFSET(n). Charge sampled on capacitor C2bx and capacitor C2cx may be combined with charge stored on a first feedback capacitor C2a to substantially compensate for (suppress) an error in a value that may nominally represent a running sum (accumulation, integral) of a sequence of input values (for example, residue R1(n)). Charge sampled on capacitor C3b and capacitor C3c may be combined with charge sampled on a first load capacitor C3a to substantially compensate for (suppress) an error in a value that may nominally represent an output value of a signal-processing operation (for example, a scaled running sum of residue R1(n)).

Figure 7C:
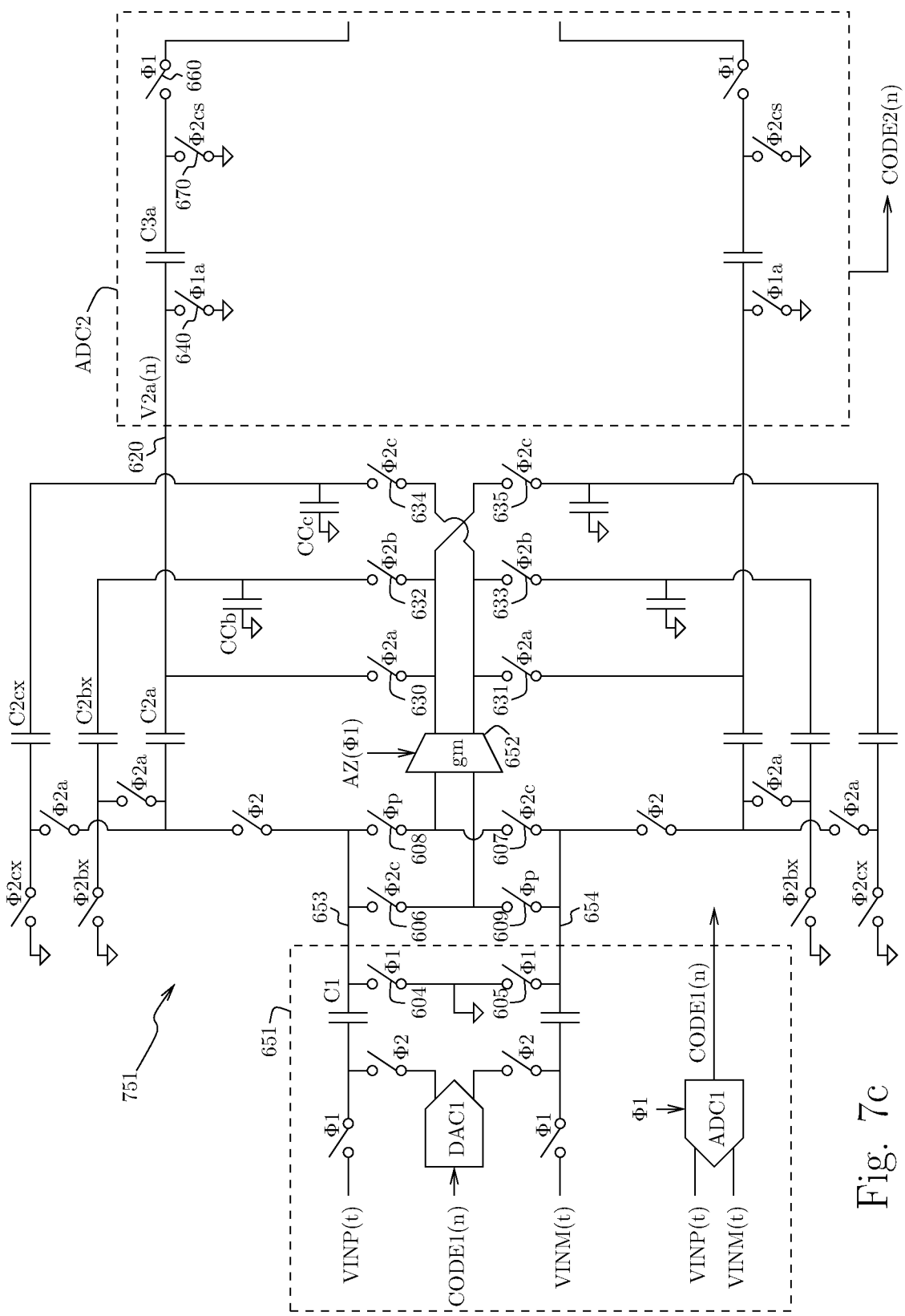
FIG. 7c shows another example integrating low-noise auto-zeroing switched-capacitor circuit, according to various embodiments.

In another embodiment shown in FIG. 7c, a variation circuit 751 of circuit 750 of FIG. 7a may include capacitor C2bx and capacitor C2cx, but not capacitor C3b and capacitor C3c. Accordingly, an embodiment may be configured to substantially compensate for errors in a running sum of a sequence of input values, while it need not be configured to substantially compensate for errors in individual output values. Such an embodiment may be appropriate for use in many applications, including various types of over-sampling applications, including but not limited to, over-sampling ADCs.

In another embodiment, an integrating low-noise auto-zeroing switched-capacitor circuit (for example, a variation of circuit 750 in FIG. 7a and circuit 751 in FIG. 7c) may be comprised in a filter, for example a bi-quad, a ladder-type, a cascaded-resonators-feedback-type, or another type of filter.

In another embodiment, a delay (for example, 10 ns) may be provided between two phases of operation (for example, phase 692 and phase 693 in FIG. 6b and FIG. 7b) to provide some time for transients (for example, caused by charge injection) to settle out after reconfiguring switches at or near an input of an amplifier circuit (for example, switch 606, switch 607, switch 608, and switch 609 in FIG. 6a and FIG. 7a).

A signal-processing circuit may be trimmed during a manufacturing process (for example, production test) or in an application (for example, background or foreground calibration and/or adaptation) to minimize a noise level of the circuit. In an example, a duration of a second phase of operation and/or third phase of operation may be trimmed to substantially cancel an error sampled during a first phase of operation. In other examples, capacitor values (for example, values of capacitor CCb and capacitor CCc in FIGS. 6a, 7a), a factor of transconductance, and/or duration of timing control signals may be trimmed to minimize a noise level. A plurality of parameters (for example, parameters related to capacitor CCb and capacitor CCc) may be trimmed independently to achieve a high degree of suppression of an offset error OFFSET(n) as well as of other errors.

A first phase of operation (for example, phase 691 in FIG. 6a, FIG. 6b, FIG. 6c, FIG. 7a, FIG. 7b, and FIG. 7c) may be used to substantially settle out large signals and transients, which may include an input signal R1(n). Subsequent phases of operation (for example, phase 692 and phase 693 in FIG. 6a, FIG. 6b, FIG. 6c, FIG. 7a, FIG. 7b, and FIG. 7c) may be used to substantially settle out relatively small signals, such as correcting for errors that may have occurred during the first phase of operation. Variation of environmental factors may cause variation of a degree of suppression of errors that may have occurred in the first phase of operation. A minimum degree of suppression that may be relied upon for all environmental factors within specified ranges thereof may substantially exceed a degree of suppression that may be needed to suppress an error. In that case, in an embodiment, a degree of settling P provided in a first phase of operation, may be substantially less (for example, a degree of settling P may be reduced by 4 or 5) than a degree of settling that may be needed for a conventional switched-capacitor circuit to achieve a required level of accuracy. For an example embodiment of this teaching, (P=6) may be a sufficient degree of settling for a first phase of operation for an application wherein a conventional switched-capacitor circuit (for example, the switched-capacitor circuit 150 in FIG. 1) may require a relatively higher degree of settling (such as, P>10) to achieve a needed degree of accuracy. Accordingly, segmenting a phase φ2 into a plurality of steps of operation (for example, compare FIG. 1 to FIG. 2, FIG. 4, FIG. 5*b*, FIG. 6*b*, and FIG. 7*b*) need not reduce a maximum sampling rate for a circuit. However, segmenting a phase φ2 into a plurality of steps of operation may substantially reduce a switched-capacitor circuit's noise level, error level, and/or its power consumption.

A first phase of operation (for example, phase 691 in FIG. 6*a*, FIG. 6*b*, FIG. 6*c*, FIG. 7*a*, FIG. 7*b*, and FIG. 7*c*) may be used to substantially settle out large signals and transients, and a relatively large quantity of charge may be stored on a first load capacitor C3*a* and/or first feedback capacitor C2*a*. Subsequent phases of operation (for example, phase 692 and phase 693 in FIG. 6*a*, FIG. 6*b*, FIG. 6*c*, FIG. 7*a*, FIG. 7*b*, and FIG. 7*c*) may be used to substantially settle out relatively small signals, and relatively smaller quantities of charge may be stored on load capacitor C3*b* and load capacitor C3*c*, and/or capacitor C2*bx* and capacitor C2*cx*. In an embodiment, a capacitance of a first load capacitor C3*a* may be significantly larger (for example, 10 times larger) than a capacitance of second load capacitor C3*b* and/or third load capacitors C3*c*. Likewise, in an embodiment, a capacitance of a first feedback capacitor C2*a* may be significantly larger (for example, 10 times larger) than a capacitance of capacitor C2*bx* and capacitor C2*cx*.

FIG. 5*b* and FIG. 7*a* illustrate that the present teaching may be used to compensate for errors (including, but not limited to, noise-like errors) in a sequence of values that may be a running sum of an input sequence of values (for example, charge on capacitor C2*a* combined with charge sampled on capacitor C2*bx* and/or capacitor C2*cx*). FIG. 5*b* and FIG. 7*a* further illustrate that the present teaching may be used to compensate for errors (including, but not limited to, noise-like errors) in individual output values (for example, charge on capacitor C3*a* combined with charge sampled on capacitor C3*b* and/or capacitor C3*c*). Embodiments of the present teaching may be configured to compensate for either type of error, or both types of errors. More generally, embodiments of the present teaching may be configured to compensate for errors in all or only some signals (output values, state variables, et cetera). Some circuits (for example, in a filter comprising a plurality of integrating circuits) may be configured to compensate for offset errors, while others need not be. Some integrators may be configured to provide a nominal loss (for example, a finite Q value). PHOSITA may analyze a circuit for its sensitivity to errors and choose to correct only for errors that may be detrimental for an application's objectives.

A "phase of operation" may be, but need not be, defined as a logical combination of timing control signals as described herein. In other embodiments, a beginning and/or an end of a phase of operation may be characterized by properties of the circuit itself (for example, self-timing circuits). In other embodiments, a phase of operation may be a combination of a plurality of periods of time, which may or may not overlap in time. For example, phase 692 and phase 693 in FIG. 6*a* and FIG. 6*b* may be considered jointly as a single phase of operation, which may be compared with a phase of operation of circuit 450 in FIG. 4 and/or a phase of operation of circuit 551 in FIG. 5*b*.

Example Implementations

The following examples are provided by way of illustration.

Example 1 may include a signal-processing circuit to receive an input value, the signal-processing circuit comprising an amplifier circuit, a first capacitor to be coupled with the amplifier circuit in a negative-feedback configuration during a first phase of operation, and a second capacitor to be coupled to the amplifier circuit during a second phase of operation, the second phase of operation to occur after the first phase of operation, wherein a quantity of charge stored on the first capacitor is to be substantially constant during the second phase of operation, wherein a signal value is to be derived responsive to the input value through combination of a first quantity of charge with a second quantity of charge, and wherein the first quantity of charge is responsive to a voltage across the first capacitor and the second quantity of charge is responsive to a voltage across the second capacitor.

Example 2 may include the signal-processing circuit of example 1, further comprising a third capacitor coupled to the first capacitor, wherein the first quantity of charge is to be stored on the third capacitor.

Example 3 may include the signal-processing circuit of example 2, further comprising a fourth capacitor, wherein the second capacitor is to be coupled to an input terminal of the amplifier circuit via the fourth capacitor during the second phase of operation.

Example 4 may include the signal-processing circuit of example 3, wherein a ratio of a capacitance of the second capacitor divided by a capacitance of the third capacitor is at least ten percent larger than a ratio of a capacitance of the fourth capacitor divided by a capacitance of the first capacitor.

Example 5 may include the signal-processing circuit of example 2, further comprising a fourth capacitor, the fourth capacitor to increase a settling time constant for the second phase of operation as compared to a settling time constant for the first phase of operation.

Example 6 may include the signal-processing circuit of example 2, wherein a quantity of charge on the second capacitor is to be nominally proportional to an error at an input terminal of the amplifier circuit at a completion of the second phase of operation.

Example 7 may include the signal-processing circuit of example 1, wherein a duration of the first phase of operation is at least six times greater than a time constant for a linear settling operation of the amplifier circuit in the negative-feedback configuration.

Example 8 may include the signal-processing circuit of example 1, wherein the amplifier circuit operates in a substantially open-loop configuration during the second phase of operation.

Example 9 may include the signal-processing circuit of example 1, wherein the signal value responsive to the input value is further to be derived through combination of a third quantity of charge with the combination of the first quantity of charge with the second quantity of charge, wherein the combination of the third quantity of charge with the combination of the first quantity of charge with the second quantity of charge is to suppress an amplifier offset error of the amplifier circuit.

Example 10 may include the signal-processing circuit of example 1, further comprising a third capacitor coupled to the first capacitor, wherein the first quantity of charge is to be stored on the third capacitor, wherein the first quantity of charge is responsive to the input value, and wherein the second quantity of charge is to be stored on the second capacitor.

Example 12 may include the signal-processing circuit of example 10, wherein the second quantity of charge on the second capacitor is to be nominally equal to a charge error at an input terminal of the amplifier circuit at a completion of the second phase of operation.

Example 13 may include the signal-processing circuit of example 2, further comprising a fourth capacitor coupled to the second capacitor to increase a settling time constant for the second phase of operation.

Example 14 may include the signal-processing circuit of example 1, wherein the first capacitor is to be reset to an initial state prior to the first phase of operation.

Example 15 may include a method for processing a signal in a signal-processing circuit, comprising during a first phase of operation, coupling a first capacitor in a negative-feedback configuration with an amplifier circuit, the amplifier circuit to charge the first capacitor responsive to an input value applied to the signal-processing circuit, during a second phase of operation wherein a quantity of charge stored on the first capacitor is to be substantially constant, coupling a second capacitor to the amplifier circuit to charge the second capacitor responsive to a potential imperfection of the quantity of charge stored on the first capacitor, and producing a signal value responsive to the input value by combining a first quantity of charge that is responsive to charge stored on the first capacitor with a second quantity of charge that is responsive to charge stored on the second capacitor.

Example 16 may include the method of example 15, wherein the negative-feedback configuration is a first negative-feedback configuration, and wherein coupling the second capacitor to the amplifier circuit during the second phase of operation comprises providing a second negative-feedback configuration during the second phase of operation.

Example 17 may include the method of example 16, wherein a capacitance of the first capacitor is at least three times greater than a capacitance of the second capacitor.

Example 18 may include the method of example 15, further comprising during the second phase of operation, coupling a first input terminal of the amplifier circuit to the first capacitor, and during a third phase of operation, coupling a second input terminal of the amplifier circuit to the first capacitor, a polarity of the second input terminal of the amplifier circuit being opposite to a polarity of the first input terminal of the amplifier circuit.

Example 19 may include the method of example 18, further comprising coupling a third capacitor to an output of the amplifier circuit during the third phase of operation, wherein the signal value is further responsive to a third charge on the third capacitor.

Example 20 may include the method of example 15, wherein a duration of the second phase of operation is at most three times greater than a time constant for a linear settling operation of the amplifier circuit during the second phase of operation.

Example 21 may include the method of example 15, herein a duration of the first phase of operation is at least six times greater than a time constant for a linear settling operation of the amplifier circuit in the negative-feedback configuration.

Example 22 may include the method of example 15, further comprising auto-zeroing an offset of the amplifier circuit prior to the first phase of operation.

Example 23 may include the method of example 15, wherein producing the signal value comprises coupling the first capacitor and the second capacitor to combine the charge stored on the first capacitor and the charge stored on the second capacitor.

Example 24 may include the method of example 15, further comprising coupling an output of the amplifier circuit to an input terminal of the amplifier circuit, wherein coupling the output of the amplifier circuit to the input terminal of the amplifier circuit causes the first capacitor and the second capacitor to be reset to an initial state prior to the first phase of operation and the second phase of operation.

Example 25 may include a signal-processing circuit, comprising a means for amplification of a signal, a first means for storing charge to be coupled in a negative-feedback configuration with the means for amplification during a first phase of operation, and a second means for storing charge to be coupled to the means for amplification during a second phase of operation, wherein a quantity of charge stored on the first means for storing charge is to be substantially constant during the second phase of operation, wherein a signal value responsive to an input value of the signal-processing circuit is to be derived by combination of a first quantity of charge with a second quantity of charge, wherein the first quantity of charge is responsive to a voltage across the first means for storing charge and the second quantity of charge is responsive to a voltage across the second means for storing charge.

Example 26 may include the signal-processing circuit of example 25, further comprising a third means for storing charge coupled to the first means for storing charge, wherein the means for amplification is to charge the first means for storing charge and the third means for storing charge responsive to the input value during the first phase of operation, and wherein the second means for storing charge and the third means for storing charge are to be coupled together after the second phase of operation to produce an output of the signal-processing circuit.

Example 27 may include the signal-processing circuit of example 26, wherein the negative-feedback configuration is a first negative-feedback configuration, wherein the signal-processing circuit further comprises a fourth means for storing charge to be coupled in a second negative-feedback configuration with the means for amplification during the second phase of operation, wherein the fourth means for storing charge is coupled to the second means for storing charge, wherein a ratio of a capacitance of the second means for storing charge divided by a capacitance of the third means for storing charge is at least ten percent larger than a ratio of a capacitance of the fourth means for storing charge divided by a capacitance of the first means for storing charge.

Example 28 may include a signal-processing circuit, comprising an amplifier circuit having an input terminal, an input value of the signal-processing circuit to be applied to the input terminal of the amplifier circuit, a feedback capacitor to be coupled in a negative-feedback configuration with the amplifier circuit during a first phase of operation, a load capacitor coupled to the feedback capacitor, wherein the amplifier circuit is to charge the feedback capacitor and the load capacitor during the first phase of operation, and a capacitor to be coupled to the amplifier circuit during a second phase of operation, wherein a quantity of charge shared by the feedback capacitor and the load capacitor is to be substantially constant during the second phase of operation, and wherein an output value of the signal-processing circuit is to be determined based on a first charge quantity on the load capacitor after the first phase of operation and a second charge quantity on the capacitor after the second phase of operation.

Example 29 may include the signal-processing circuit of example 28, wherein the load capacitor is a first load capacitor, wherein the capacitor is a second load capacitor, wherein the output value comprises a combination of the first charge quantity on the first load capacitor in combination with the second charge quantity on the second load capacitor, and wherein the first charge quantity on the first load capacitor and the second charge quantity on the second load capacitor are based on the input value of the signal-processing circuit.

Example 30 may include the signal-processing circuit of example 29, wherein the feedback capacitor is a first feedback capacitor, and wherein the second load capacitor is to be coupled to the input terminal of the amplifier circuit via a second feedback capacitor during the second phase of operation.

Example 31 may include the signal-processing circuit of example 30, wherein a ratio of a capacitance of the second load capacitor divided by a capacitance of the first load capacitor is at least ten percent larger than a ratio of a capacitance of the second feedback capacitor divided by a capacitance of the first feedback capacitor.

Example 32 may include the signal-processing circuit of example 29, further comprising a second capacitor coupled between the second load capacitor and a substantially constant bias potential of the signal-processing circuit, the second capacitor to increase a settling time constant for the second phase of operation.

Example 33 may include the signal-processing circuit of example 28, wherein a duration of the first phase of operation is at least six times greater than a time constant for a linear settling operation of the amplifier circuit in the negative-feedback configuration.

Example 34 may include the signal-processing circuit of example 28, wherein the amplifier circuit operates in a substantially open-loop configuration during the second phase of operation.

Example 35 may include the signal-processing circuit of example 28, wherein the capacitor is to be coupled between an output of the amplifier circuit and a substantially constant bias potential of the signal-processing circuit during the second phase of operation, and wherein the second charge quantity on the capacitor is to be nominally equal to a charge error at the input terminal of the amplifier circuit at a completion of the second phase of operation.

Example 36 may include the signal-processing circuit of example 28, wherein the feedback capacitor is to be reset to an initial state in a third phase of operation, and wherein the third phase of operation is to precede the first phase of operation and the second phase of operation.

Example 37 may include a method for processing a signal in a signal-processing circuit, comprising applying an input value at an input terminal of an amplifier circuit, coupling a feedback capacitor in a negative-feedback configuration with the amplifier circuit during a first phase of operation, the amplifier circuit to charge the feedback capacitor and a load capacitor during the first phase of operation, the load capacitor coupled to the feedback capacitor, coupling a capacitor to the amplifier circuit during a second phase of operation, the amplifier circuit to charge the capacitor during the second phase of operation, wherein a quantity of charge shared by the feedback capacitor and the load capacitor is to be substantially constant during the second phase of operation, and producing an output value based on a first charge quantity on the load capacitor after the first phase of operation and a second charge quantity on the capacitor after the second phase of operation, wherein the first charge quantity on the load capacitor and the second charge quantity on the capacitor are based on the input value.

Example 38 may include the method of example 37, wherein the negative-feedback configuration is a first negative-feedback configuration, and wherein coupling the capacitor to the amplifier circuit during the second phase of operation comprises coupling the capacitor in a second negative-feedback configuration during the second phase of operation.

Example 39 may include the method of example 38, wherein a capacitance of the feedback capacitor is greater than a capacitance of the capacitor.

Example 40 may include the method of example 37, further comprising swapping a polarity of the input value to the input terminal of the amplifier circuit during a third phase of operation, the input value being a differential input value, and swapping an output of the amplifier circuit during the third phase of operation, wherein the output of the amplifier circuit contributes to an opposite output of the signal-processing circuit during the third phase of operation than in other phases of operation, the output of the signal-processing circuit being a differential output of the signal-processing circuit.

Example 41 may include the method of example 40, wherein the load capacitor is a first load capacitor, wherein the method further comprises coupling a second load capacitor to the output of the amplifier circuit during the third phase of operation, and wherein the output value is further based on a third charge on the second load capacitor after the third phase of operation.

Example 42 may include the method of example 37, wherein producing the output value comprises coupling the load capacitor and the capacitor to combine the first charge quantity and the second charge quantity.

Example 43 may include the method of example 37, further comprising coupling an output of the amplifier circuit to the input terminal of the amplifier circuit during a third phase of operation, the third phase of operation preceding the first phase of operation and the second phase of operation, wherein coupling the output of the amplifier circuit to the input terminal of the amplifier circuit causes the feedback capacitor and the capacitor to be reset to an initial state.

Example 44 may include the method of example 37, wherein the amplifier circuit comprises a first transconductance circuit coupled to the input terminal of the amplifier circuit and a second transconductance circuit having an output of the second transconductance circuit coupled to an output of the first transconductance circuit, wherein the method further comprises coupling the output of the first transconductance circuit to an input of the second transconductance circuit during a third phase of operation, the third phase of operation preceding the first phase of operation and the second phase of operation, and wherein coupling the output of the first transconductance circuit to the input of the second transconductance circuit is to perform an auto-zeroing operation.

Example 45 may include a signal-processing circuit, comprising a means for amplifying an input of the signal-processing circuit, a first means for storing charge to be coupled in a negative-feedback configuration with the means for amplifying during a first phase of operation, a second means for storing charge coupled to the first means for storing charge, wherein the means for amplifying is to charge the first means for storing charge and the second means for storing charge based on the input of the signal-processing circuit during the first phase of operation, and a third means for storing charge to be coupled to the means for amplifying during a second phase of operation, the means for amplifying to charge the third means for storing charge during the second phase of operation, wherein a quantity of charge shared by the first means for storing charge and the second means for storing charge is to be substantially constant during the second phase of operation, and wherein an output value of the signal-processing circuit is to be determined based on a first charge quantity on the second means for storing charge after the first phase of operation and a second charge quantity on the third means for storing charge after the second phase of operation.

Example 46 may include the signal-processing circuit of example 45, wherein the second means for storing charge and the third means for storing charge are coupled together during a third phase of operation to produce an output of the signal-processing circuit, and wherein the third phase of operation is to be preceded by the first phase of operation and the second phase of operation.

Example 47 may include the signal-processing circuit of example 45, wherein the negative-feedback configuration is a first negative-feedback configuration, wherein the signal-processing circuit further comprises a fourth means for storing charge to be coupled in a second negative-feedback configuration with the means for amplifying during the second phase of operation, wherein the fourth means for storing charge is coupled to the third means for storing charge, and wherein a ratio of a capacitance of the third means for storing charge divided by a capacitance of the second means for storing charge is at least ten percent larger than a ratio of a capacitance of the fourth means for storing charge divided by a first means for storing charge.

Example 48 may include a signal-processing circuit, comprising an amplifier circuit having an input terminal, a first load capacitor coupled to the input terminal of the amplifier circuit via a first feedback capacitor, and a first switch for coupling the first feedback capacitor and the amplifier circuit in a negative-feedback configuration during a first phase of operation, the first phase of operation preceding a second phase of operation, wherein the amplifier circuit charges the first feedback capacitor and the first load capacitor during the first phase of operation, wherein a quantity of charge shared by the first feedback capacitor and the first load capacitor is substantially constant during the second phase of operation, wherein the amplifier circuit is coupled to a second load capacitor during the second phase of operation, and wherein a combination of a first charge quantity sampled on the first load capacitor in combination with a second charge quantity sampled on the second load capacitor is an output value derived from an input value.

Example 49 may include the signal-processing circuit of example 48, wherein the second load capacitor is coupled to the input terminal of the amplifier circuit via a second feedback capacitor.

Example 50 may include the signal-processing circuit of example 49, wherein a ratio of a capacitance of the second load capacitor divided by a capacitance of the first load capacitor is at least 10 percent larger than a ratio of a capacitance of the second feedback capacitor divided by a capacitance of the first feedback capacitor.

Example 51 may include the signal-processing circuit of example 48, wherein a duration of the first phase of operation is at least six times greater than a time constant for a linear settling operation of the amplifier circuit in the negative-feedback configuration.

Example 52 may include the signal-processing circuit of example 48, wherein the amplifier circuit operates in a substantially open-loop configuration during the second phase of operation.

Example 53 may include the signal-processing circuit of example 48, wherein the signal-processing circuit is to amplify a residue value in an analog-to-digital conversion circuit.

Example 54 may include the signal-processing circuit of example 48, wherein the output value is a first output value, wherein the first output value is derived from the input value in a signal-processing operation that combines the input value with a second output value, the second output value being from a previous cycle of operation.

Example 55 may include the signal-processing circuit of example 48, wherein the signal-processing circuit is to derive a running sum of a sequence of residue values in an analog-to-digital conversion circuit.

Example 56 may include the signal-processing circuit of example 48, wherein the quantity of charge is a first quantity of charge, wherein the input value is a first input value, wherein the signal-processing circuit further comprises a correction capacitor to sample a second quantity of charge that is substantially linearly related with the second charge quantity sampled on the second load capacitor, wherein the second quantity of charge sampled by the correction capacitor is combined with a second input value in a subsequent cycle of operation.

Example 57 may include the signal-processing circuit of example 48, further comprising a third load capacitor coupled to the amplifier circuit during a third phase of operation, wherein a charge quantity sampled on the third load capacitor substantially cancels a contribution from an offset of the amplifier circuit to the output value.

Example 58 may include a signal-processing method, comprising adjusting a first value gradually during a first step to regulate a predefined combination of the first value and an input value towards a target, holding the first value substantially constant after the first step, and deriving, in a second step after the first step, a second value responsive to a difference between the target and the predefined combination of the first value and the input value, wherein a sampled combination of the first value and the second value is derived from the input value substantially in accordance with a predefined signal-processing operation.

Example 59 may include the signal-processing method of example 58, wherein adjusting the first value gradually during the first step includes combining a charge quantity derived from the first value with a charge quantity derived from the input value.

Example 60 may include the signal-processing method of example 58, wherein holding the first value substantially constant after the first step includes isolating substantially a quantity of charge derived from the first value.

Example 61 may include the signal-processing method of example 58, wherein adjusting the first value gradually during the first step includes amplifying the difference between the target and the predefined combination of the first value and the input value.

Example 62 may include the signal-processing method of example 58, wherein deriving the second value includes combining the second value with the predefined combination of the first value and the input value.

Example 63 may include the signal-processing method of example 58, wherein deriving the second value includes adjusting the second value gradually during the second step to regulate a combination of the second value and the predefined combination of the first value and the input value towards the target.

Example 64 may include the signal-processing method of example 58, wherein deriving the second value includes amplifying the difference between the target and the predefined combination of the first value and the input value.

Example 65 may include the signal-processing method of example 58, further comprising providing an auto-zeroing operation.

Example 66 may include the signal-processing method of example 58, further including holding the second value substantially constant after the second step, and deriving, in a third step after the second step, a third value responsive to a difference between the target and a combination of the first value and the input value.

Example 67 may include the signal-processing method of example 58, wherein the predefined signal-processing operation is to amplify a residue value derived in an analog-to-digital conversion operation.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include or be implemented a system on chip (SoC) central processing unit (CPU) package. An SoC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. Any module, function, or block element of an ASIC or SoC can be provided, where appropriate, in a reusable "black box" intellectual property (IP) block, which can be distributed separately without disclosing the logical details of the IP block. In various other embodiments, the digital signal-processing functionalities may be implemented in one or more silicon cores in application-specific integrated circuits (ASICs), field-programmable gate arrays (FPGAs), and other semiconductor chips.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machinereadable mediums suitable for storing electronic instructions, or any suitable combination thereof. In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (for example, via an interpreter), or the source code may be converted (for example, via a translator, assembler, or compiler) into a computer executable form.

In the discussions of the embodiments above, the capacitors, buffers, graphics elements, interconnect boards, clocks, DDRs, camera sensors, converters, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (for example, a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

What is claimed is:

1. A signal-processing circuit to receive an input value, the signal-processing circuit comprising:
   an amplifier circuit;
   a first capacitor to be coupled with the amplifier circuit in a negative-feedback configuration during a first phase of operation; and
   a second capacitor to be coupled to the amplifier circuit during a second phase of operation, the second phase of operation to occur after the first phase of operation, wherein a quantity of charge stored on the first capacitor is to be substantially constant during the second phase of operation, wherein a signal value responsive to the input value is to be derived through combination of a first quantity of charge with a second quantity of charge, and wherein the first quantity of charge is responsive to a voltage across the first capacitor and the second quantity of charge is responsive to a voltage across the second capacitor.

2. The signal-processing circuit of claim 1, further comprising a third capacitor coupled to the first capacitor, wherein the first quantity of charge is to be stored on the third capacitor.

3. The signal-processing circuit of claim 2, further comprising a fourth capacitor, wherein the second capacitor is to be coupled to an input terminal of the amplifier circuit via the fourth capacitor during the second phase of operation.

4. The signal-processing circuit of claim 3, wherein a ratio of a capacitance of the second capacitor divided by a capacitance of the third capacitor is at least ten percent larger than a ratio of a capacitance of the fourth capacitor divided by a capacitance of the first capacitor.

5. The signal-processing circuit of claim 2, further comprising a fourth capacitor, the fourth capacitor to increase a settling time constant for the second phase of operation as compared to a settling time constant for the first phase of operation.

6. The signal-processing circuit of claim 2, wherein a quantity of charge on the second capacitor is to be nominally proportional to an error at an input terminal of the amplifier circuit at a completion of the second phase of operation.

7. The signal-processing circuit of claim 1, wherein a duration of the first phase of operation is at least six times greater than a time constant for a linear settling operation of the amplifier circuit in the negative-feedback configuration.

8. The signal-processing circuit of claim 1, wherein the amplifier circuit operates in a substantially open-loop configuration during the second phase of operation.

9. The signal-processing circuit of claim 1, wherein the signal value responsive to the input value is further to be derived through combination of a third quantity of charge with the combination of the first quantity of charge with the second quantity of charge, wherein the combination of the third quantity of charge with the combination of the first quantity of charge with the second quantity of charge is to suppress an amplifier offset error of the amplifier circuit.

10. A method for processing a signal in a signal-processing circuit, comprising:
during a first phase of operation, coupling a first capacitor in a negative-feedback configuration with an amplifier circuit, the amplifier circuit to charge the first capacitor responsive to an input value applied to the signal-processing circuit;
during a second phase of operation wherein a quantity of charge stored on the first capacitor is to be substantially constant, coupling a second capacitor to the amplifier circuit to charge the second capacitor responsive to a potential imperfection of the quantity of charge stored on the first capacitor; and
producing a signal value responsive to the input value by combining a first quantity of charge that is responsive to charge stored on the first capacitor with a second quantity of charge that is responsive to charge stored on the second capacitor.

11. The method of claim 10, wherein the negative-feedback configuration is a first negative-feedback configuration, and wherein coupling the second capacitor to the amplifier circuit during the second phase of operation comprises providing a second negative-feedback configuration during the second phase of operation.

12. The method of claim 11, wherein a capacitance of the first capacitor is at least three times greater than a capacitance of the second capacitor.

13. The method of claim 10, further comprising:
during the second phase of operation, coupling a first input terminal of the amplifier circuit to the first capacitor; and
during a third phase of operation, coupling a second input terminal of the amplifier circuit to the first capacitor, a polarity of the second input terminal of the amplifier circuit being opposite to a polarity of the first input terminal of the amplifier circuit.

14. The method of claim 13, further comprising:
coupling a third capacitor to an output of the amplifier circuit during the third phase of operation, wherein the signal value is further responsive to a third charge on the third capacitor.

15. The method of claim 10, wherein a duration of the second phase of operation is at most three times greater than a time constant for a linear settling operation of the amplifier circuit during the second phase of operation.

16. The method of claim 10, wherein a duration of the first phase of operation is at least six times greater than a time constant for a linear settling operation of the amplifier circuit in the negative-feedback configuration.

17. The method of claim 10, further comprising:
auto-zeroing an offset of the amplifier circuit prior to the first phase of operation.

18. A signal-processing circuit, comprising:
a means for amplification of a signal;
a first means for storing charge to be coupled in a negative-feedback configuration with the means for amplification during a first phase of operation; and
a second means for storing charge to be coupled to the means for amplification during a second phase of operation, wherein a quantity of charge stored on the first means for storing charge is to be substantially constant during the second phase of operation, wherein a signal value responsive to an input value of the signal-processing circuit is to be derived by combination of a first quantity of charge with a second quantity of charge, wherein the first quantity of charge is responsive to a voltage across the first means for storing charge and the second quantity of charge is responsive to a voltage across the second means for storing charge.

19. The signal-processing circuit of claim 18, further comprising:
a third means for storing charge coupled to the first means for storing charge, wherein the means for amplification is to charge the first means for storing charge and the third means for storing charge responsive to the input value during the first phase of operation, and wherein the second means for storing charge and the third means for storing charge are to be coupled together after the second phase of operation to produce an output of the signal-processing circuit.

20. The signal-processing circuit of claim 19, wherein the negative-feedback configuration is a first negative-feedback configuration, wherein the signal-processing circuit further comprises:
a fourth means for storing charge to be coupled in a second negative-feedback configuration with the means for amplification during the second phase of operation, wherein the fourth means for storing charge is coupled to the second means for storing charge, wherein a ratio of a capacitance of the second means for storing charge divided by a capacitance of the third means for storing charge is at least ten percent larger than a ratio of a capacitance of the fourth means for storing charge divided by a capacitance of the first means for storing charge.

* * * * *